United States Patent
Saito et al.

(10) Patent No.: US 10,121,678 B2
(45) Date of Patent: Nov. 6, 2018

(54) METHOD OF MANUFACTURING SEMICONDUCTOR DEVICE

(71) Applicant: RENESAS ELECTRONICS CORPORATION, Tokyo (JP)

(72) Inventors: Hirokazu Saito, Tokyo (JP); Takuya Hagiwara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/689,964

(22) Filed: Aug. 29, 2017

(65) Prior Publication Data

US 2018/0061664 A1 Mar. 1, 2018

(30) Foreign Application Priority Data

Aug. 31, 2016 (JP) .................................. 2016-169496

(51) Int. Cl.
| | |
|---|---|
| *H01L 21/3213* | (2006.01) |
| *H01L 21/68* | (2006.01) |
| *H01L 21/027* | (2006.01) |
| *H01L 21/47* | (2006.01) |
| *H01L 21/033* | (2006.01) |
| *H01L 21/225* | (2006.01) |

(52) U.S. Cl.
CPC .... *H01L 21/32139* (2013.01); *H01L 21/0273* (2013.01); *H01L 21/0332* (2013.01); *H01L 21/2253* (2013.01); *H01L 21/47* (2013.01); *H01L 21/682* (2013.01)

(58) Field of Classification Search
None
See application file for complete search history.

(56) References Cited

U.S. PATENT DOCUMENTS

| | | | |
|---|---|---|---|
| 6,939,777 B2 | 9/2005 | Ohto et al. | |
| 2011/0037069 A1* | 2/2011 | West | H01L 22/12 |
| | | | 257/48 |

FOREIGN PATENT DOCUMENTS

| | | |
|---|---|---|
| JP | 2000-292905 A | 10/2000 |
| JP | 2005-150251 A | 6/2005 |

* cited by examiner

*Primary Examiner* — Eva Y Montalvo
*Assistant Examiner* — Kevin Quinto
(74) *Attorney, Agent, or Firm* — McDermott Will & Emery LLP

(57) ABSTRACT

A method of manufacturing a semiconductor device includes forming a reference pattern in an inspection pattern formation region, forming a first mask layer over a semiconductor substrate, while forming a first inspection pattern in the inspection pattern formation region, and measuring a first amount of misalignment of the first inspection pattern with respect to the reference pattern. The method further includes implanting ions into the semiconductor substrate using a first mask layer, removing the first mask layer and the first inspection pattern and then forming a second mask layer over the semiconductor substrate, while forming a second inspection pattern in the inspection pattern formation region, and measuring a second amount of misalignment of the second inspection pattern with respect to the reference pattern. In plan view, the second inspection pattern is larger than the first inspection pattern and covers the entire region where the first inspection pattern is formed.

17 Claims, 27 Drawing Sheets

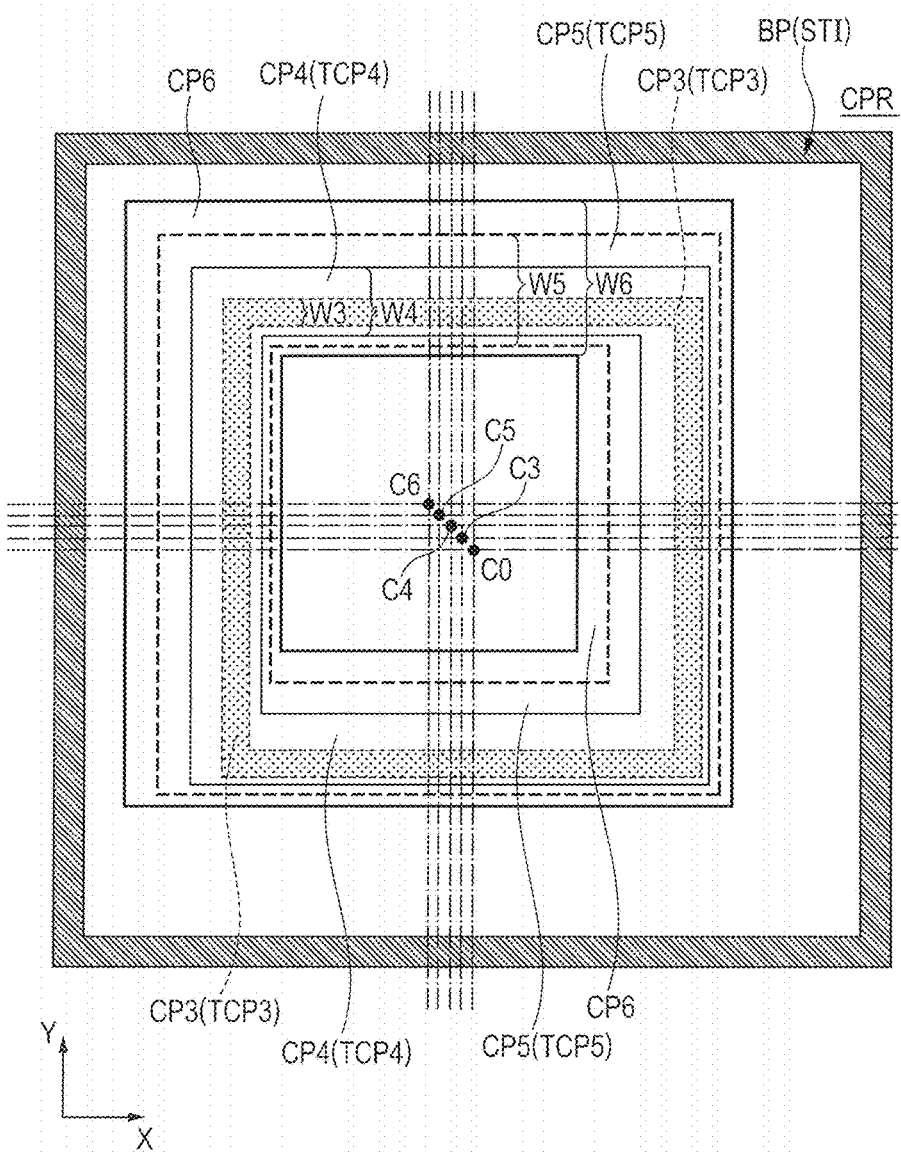

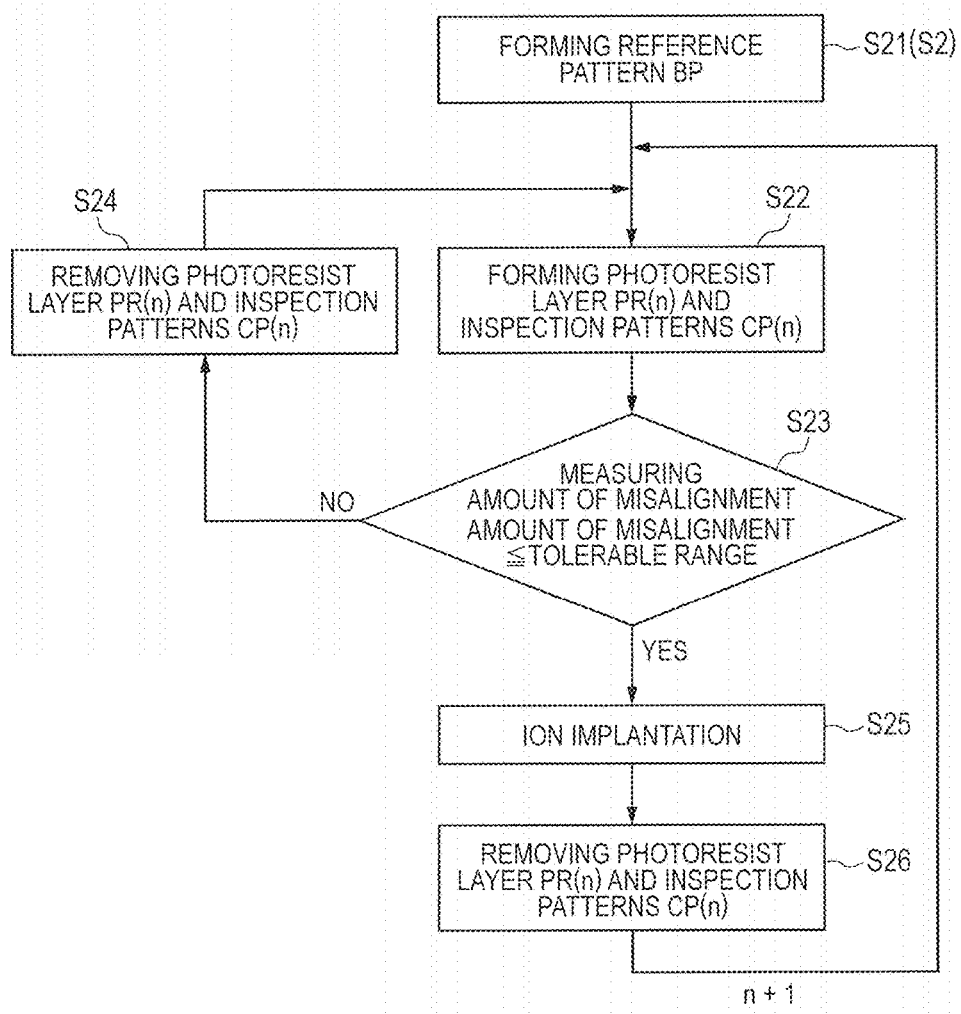

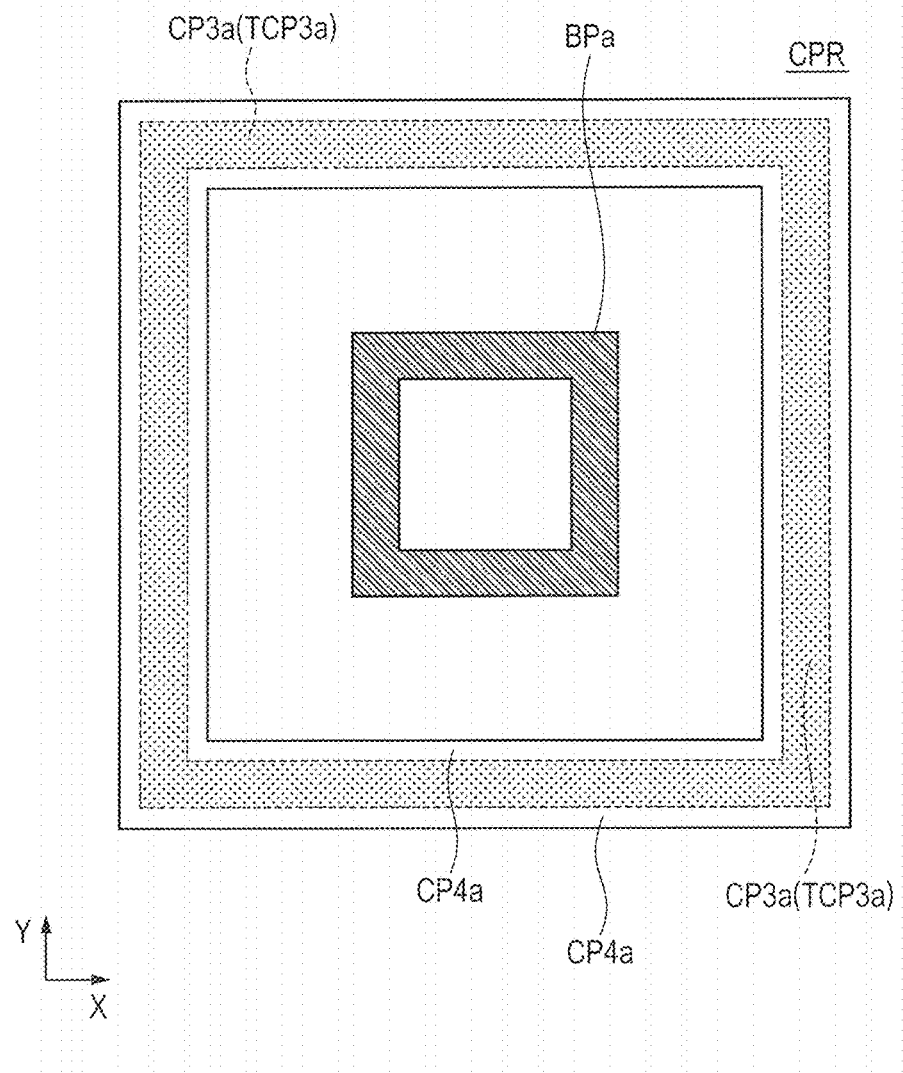

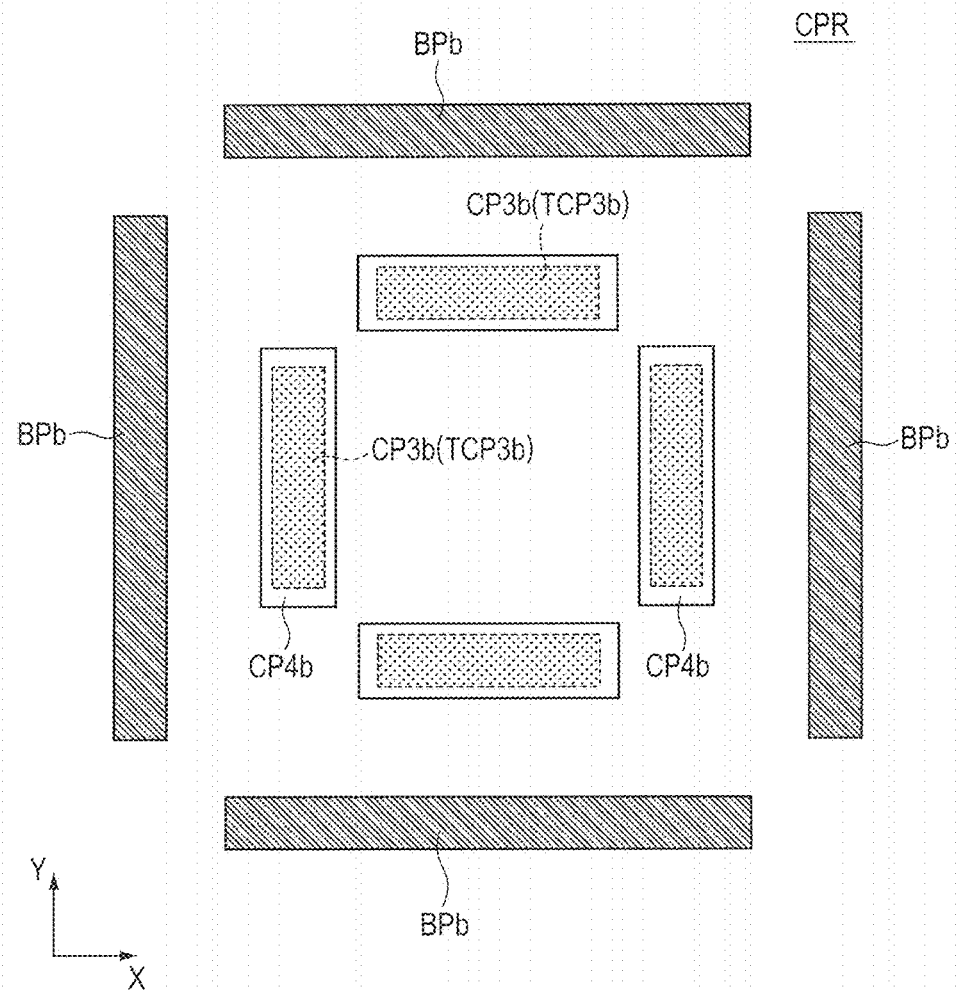

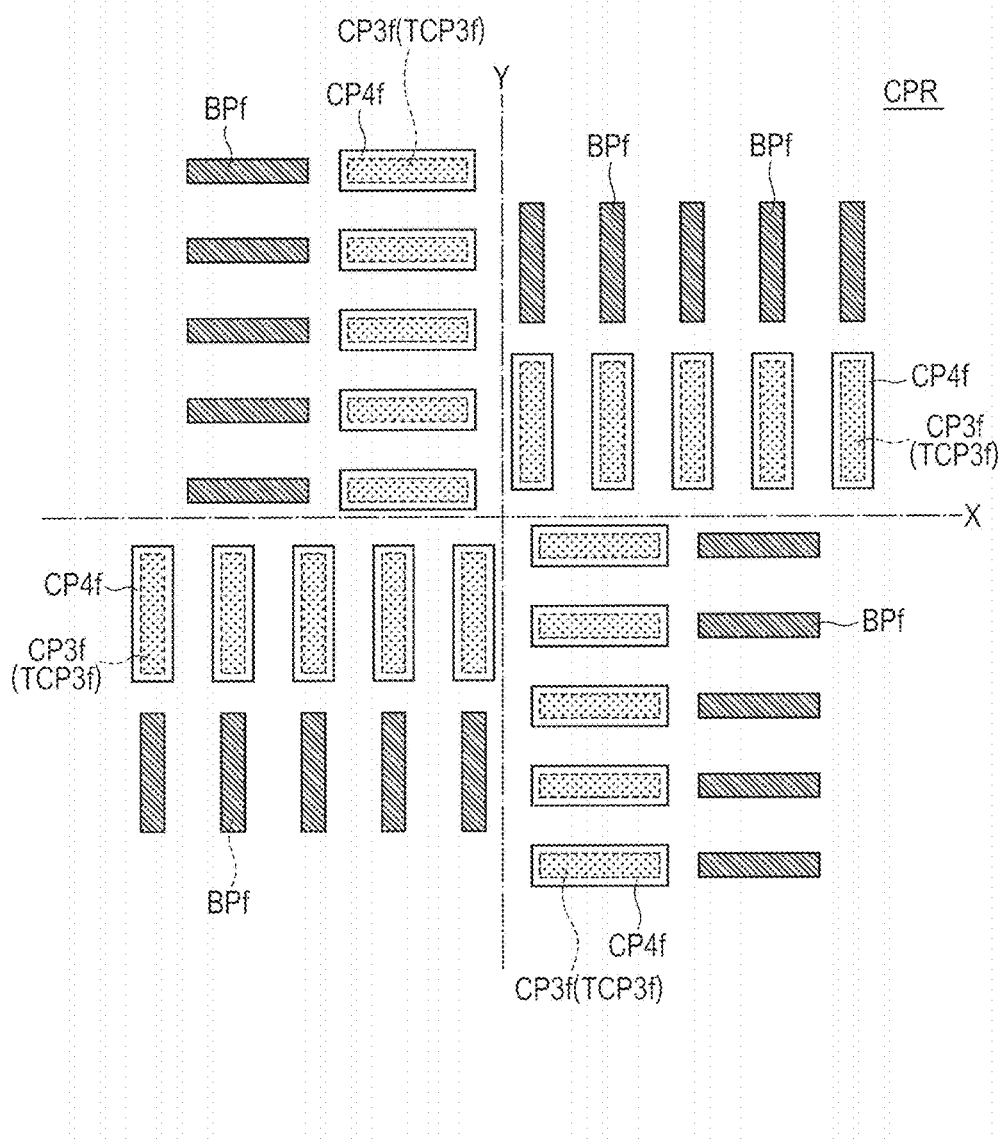

METHOD OF MANUFACTURING SEMICONDUCTOR DEVICE

CROSS-REFERENCE TO RELATED APPLICATIONS

The disclosure of Japanese Patent Application No. 2016-169496 filed on Aug. 31, 2016 including the specification, drawings and abstract is incorporated herein by reference in its entirety.

BACKGROUND

The present invention relates to a method of manufacturing a semiconductor device, and particularly to a technique which is effective when applied to a method of manufacturing a semiconductor device having an inspection pattern for inspecting mask misalignment in a lithographic step for ion implantation.

The manufacturing process of a semiconductor device includes a plurality of lithographic steps to process a conductor film or an insulating film into an intended shape or to form a mask layer for use in ion-implanting an impurity into a semiconductor substrate or the like. In each of the lithographic steps, using, e.g., a reduced projection exposure method or the like, a mask pattern formed over a mask or reticle (hereinafter generally referred to as a mask) is transferred onto a photoresist layer formed over the semiconductor substrate. In the transfer step, an alignment mark pattern formed over the semiconductor substrate is detected and a mask is aligned (positioned) with respect to the alignment mark pattern, and then exposure treatment is performed. Then, development treatment and baking treatment are performed on the photoresist layer subjected to the exposure treatment to complete a photoresist mask having a pattern equal to the mask pattern. Then, using the photoresist mask, a conductor film, an insulating film, or the like is processed or impurity ions are implanted.

However, in the formation of the photoresist mask, mask misalignment with respect to an underlying layer formed in the semiconductor substrate occurs. Accordingly, using the photoresist layer used to form the photoresist mask, an inspection pattern is simultaneously formed, and an amount of misalignment of the inspection pattern with respect to an alignment target layer (alignment target mark) formed of the underlying layer is measured.

Japanese Unexamined Patent Publication No. 2005-150251 (Patent Document 1) relates to an improvement in alignment mark portion (mark pattern mentioned above).

Japanese Unexamined Patent Publication No. 2000-292905 (Patent Document 2) relates to improvements in mark pattern and misalignment inspection pattern.

RELATED ART DOCUMENTS

Patent Documents

[Patent Document 1] Japanese Unexamined Patent Publication No. 2005-150251
[Patent Document 2] Japanese Unexamined Patent Publication No. 2000-292905

SUMMARY

The inspection pattern described above does not directly relate to the operation of a semiconductor device and is therefore generally disposed in a scribe region. However, an inspection pattern needs to be provided for each one of a large number of lithographic steps so that a plurality of inspection patterns are disposed in the scribe region in the individual lithographic steps. As a result, a problem arises in that the number of the inspection patterns significantly increases to increase the area of the scribe region.

To solve such a problem, a plurality of inspection patterns formed in multi-layer lithographic steps for forming mask layers for ion implantation are disposed at the same position. That is, a technique is used which disposes a first inspection pattern for the preceding first ion implantation step and a second inspection pattern for the subsequent second ion implantation step at the same position. This can be achieved because, when the first ion implantation step is completed, the first inspection pattern is removed and consequently the second inspection pattern can be formed at the same position.

In the scribe region, an enormous number of elements for inspecting the characteristics of elements and the like are disposed in addition to the inspection patterns. Accordingly, reducing the number of the inspection patterns using the foregoing technique is effective in reducing the size of a semiconductor device.

On the other hand, the increasing miniaturization of semiconductor devices has narrowed down a tolerable range for the amount of the misalignment described above. Consequently, in the measurement of the amount of misalignment of each of the inspection patterns, it is required to improve the detection accuracy of the inspection pattern.

However, as a result of conducting study, the present inventors have recognized the problem that, in the detection of the second inspection pattern using the foregoing technique, the detection accuracy of the second inspection pattern is influenced and degraded by a trace of the first inspection pattern which is left in the region where the first inspection pattern was formed.

In a method of manufacturing a semiconductor device, it is required to improve the detection accuracy of an inspection pattern.

Other problems and novel features of the present invention will become apparent from a statement in the present specification and the accompanying drawings.

A method of manufacturing a semiconductor device according to an embodiment includes the step of forming a reference pattern in an inspection pattern formation region, the step of forming a first mask layer over a semiconductor substrate, while forming a first inspection pattern in the inspection pattern formation region, and the step of measuring a first amount of misalignment of the first inspection pattern with respect to the reference pattern. The method of manufacturing the semiconductor device further includes the step of implanting ions into the semiconductor substrate using the first mask layer, the step of removing the first mask layer and the first inspection pattern and then forming a second mask layer over the semiconductor substrate, while forming a second inspection pattern in the inspection pattern formation region, and the step of measuring a second amount of displacement of the second inspection pattern with respect to the reference pattern. In plan view, the second inspection pattern is larger than the first inspection pattern and covers the entire region where the first inspection pattern was formed.

According to the embodiment, in the method of manufacturing the semiconductor device, the detection accuracy of an inspection pattern can be improved.

BRIEF DESCRIPTION OF THE DRAWINGS

FIG. 16 is a plan view of the inspection pattern formation region in the semiconductor device in the embodiment;

FIG. 17 is a process flow chart of a part of the manufacturing process of the semiconductor device in the embodiment;

FIG. 18 is a plan view of an inspection pattern formation region in Modification 1;

FIG. 19 is a plan view of an inspection pattern formation region in Modification 2;

FIG. 23 is a plan view of an inspection pattern formation region in Modification 6;

DETAILED DESCRIPTION

Figure 1:
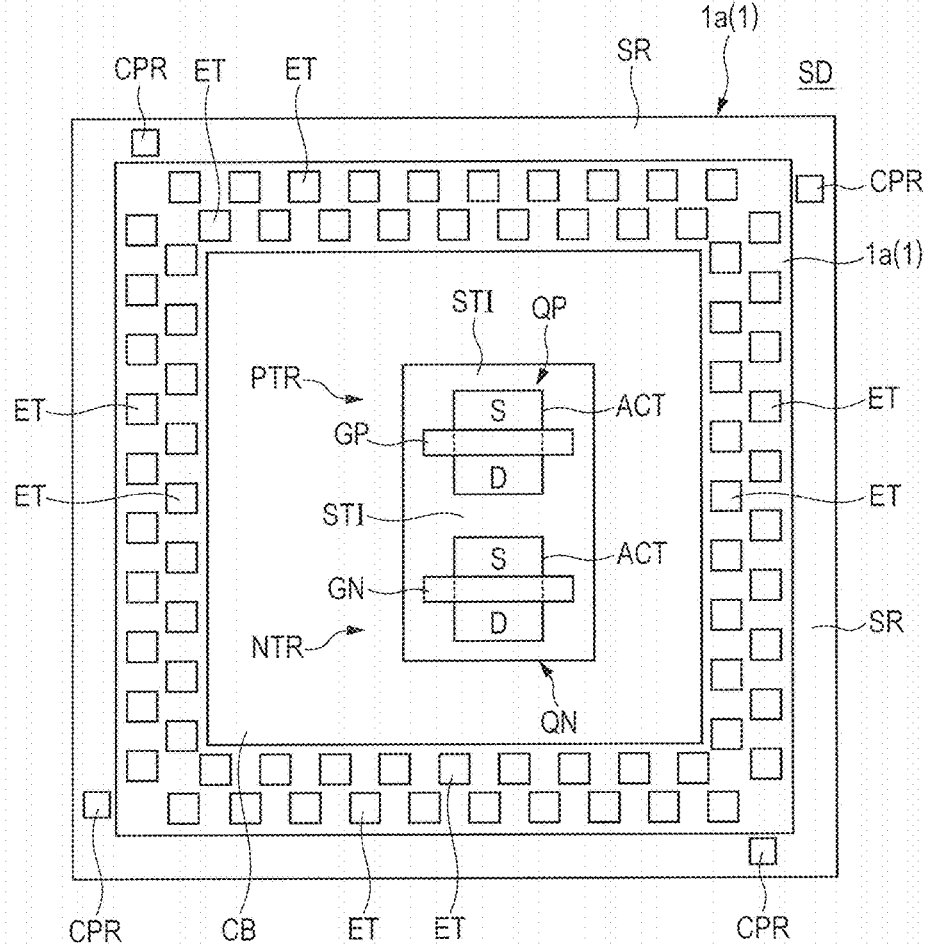
FIG. 1 is a plan view of a semiconductor device in an embodiment.

In the following embodiment, if necessary for the sake of convenience, the embodiment will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiment, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also, in the following embodiment, it goes without saying that the components thereof (including also elements, steps, and the like) are not necessarily indispensable unless particularly explicitly described otherwise or unless the components are considered to be obviously indispensable in principle.

Likewise, if the shapes, positional relationships, and the like of the components and the like are referred to in the following embodiment, the shapes and the like are assumed to include those substantially proximate or similar thereto and the like unless particularly explicitly described otherwise or unless it can be considered that they obviously do not in principle. The same shall apply in regard to the foregoing numerical value and range.

Throughout all the drawings for illustrating the embodiment, like members are designated by like reference numerals in principle, and a repeated description thereof is omitted. Note that, for improved clarity of illustration, even a plan view may be hatched.

(Embodiment)

<Structure of Semiconductor Device>

FIG. 1 is a plan view of a semiconductor device in the present embodiment. As shown in FIG. 1, a semiconductor device SD includes a semiconductor substrate 1 which is rectangular (square or oblong) in plan view. A main surface 1a of the semiconductor substrate 1 has a circuit block region CB disposed at the center portion thereof, a plurality of external coupling terminals ET arranged around the circuit block region CB, and a scribe region (dicing region) SR disposed in the end portion of the semiconductor substrate 1 so as to surround the circuit block region CB and the external coupling terminals ET.

In the circuit block region CB, a logic circuit, a memory circuit, or the like is formed. Such a circuit includes an re-channel MISFET QN and a p-channel MISFET QP. The n-channel MISFET QN is formed in an active region ACT peripherally surrounded by an isolation film STI and has a gate electrode GN, a source region S made of an n-type semiconductor region, and a drain region D made of an n-type semiconductor region. The p-channel MISFET QP is formed in the active region ACT peripherally surrounded by the isolation film STI and has a gate electrode GP, the source region S made of a p-type semiconductor region, and the drain region D made of a p-type semiconductor region. In the circuit block region C, a plurality of the p-channel MISFETs QP and a plurality of the n-channel MISFETs QN are formed.

The plurality of external terminals ET are disposed between the circuit block region CB and the sides of the semiconductor substrate 1. Along each of the sides, the plurality of external coupling terminals ET are arranged in a linear configuration. In the present embodiment, the external coupling terminals ET are arranged in two rows in a staggered pattern along each of the sides. However, the arrangement of the external coupling terminals ET is not limited thereto. Each of the external coupling terminals ET is coupled to the logic circuit, the memory circuit, or the like in the circuit block region CB.

In the scribe region SR located outside the rows of the external coupling terminals ET, a plurality of inspection pattern formation regions CPR are disposed. Each of the inspection pattern formation regions CPR is disposed beside each of the sides (four sides) of the semiconductor substrate 1 on a one-to-one basis.

<Method of Manufacturing Semiconductor Device>

Figure 24A:
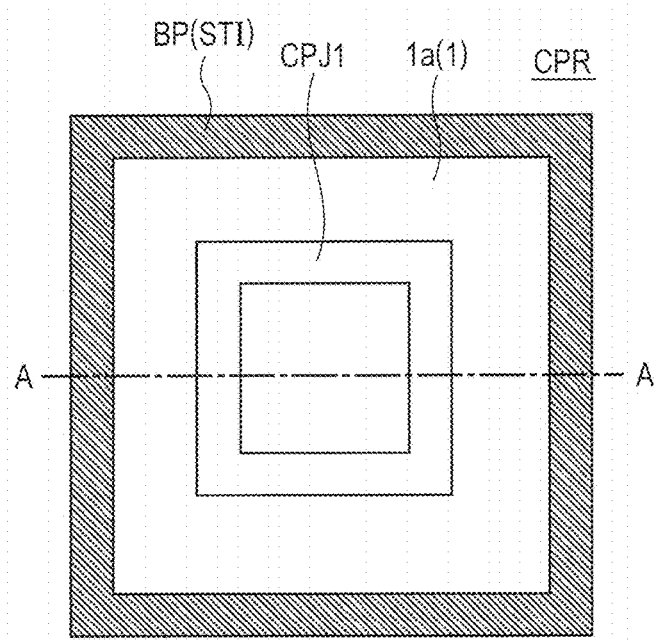
FIG. 24A is a plan view of an inspection pattern formation region in a semiconductor device in a studied example during the manufacturing process thereof and FIG. 24B is a view showing a light intensity along the line A-A.
Figure 24B:
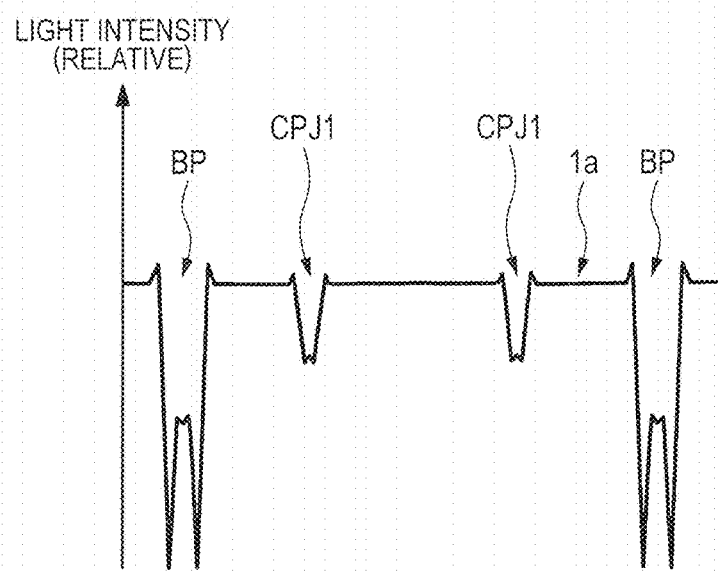
Figure 25A:
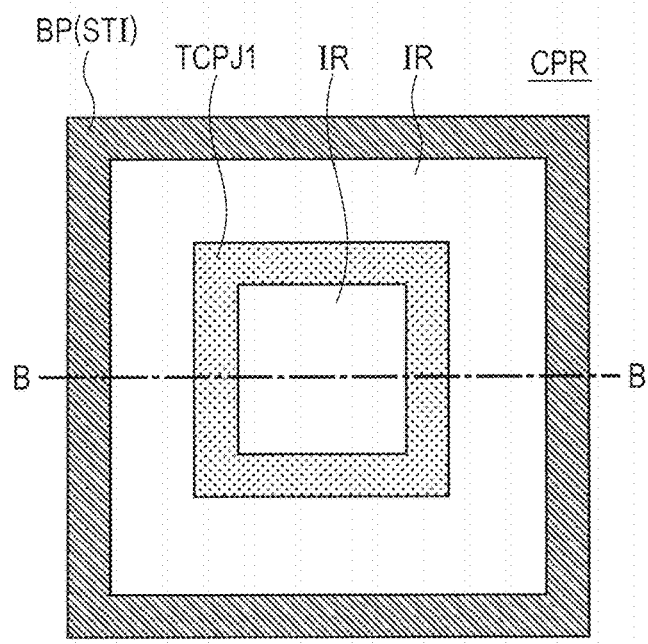
FIG. 25A is a plan view of the inspection pattern formation region in the semiconductor device during the manufacturing process thereof, which is subsequent to FIGS. 24A and 24B.
Figure 25B:
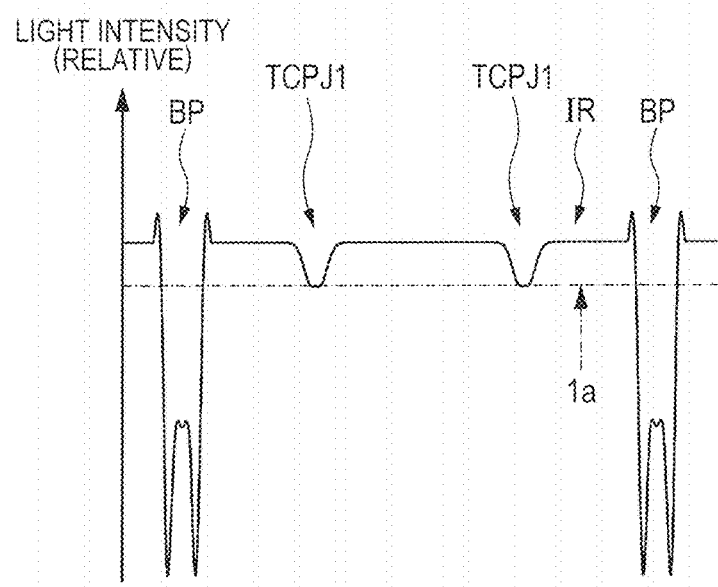
FIG. 25B is a view showing a light intensity along the line B-B.
Figure 26:
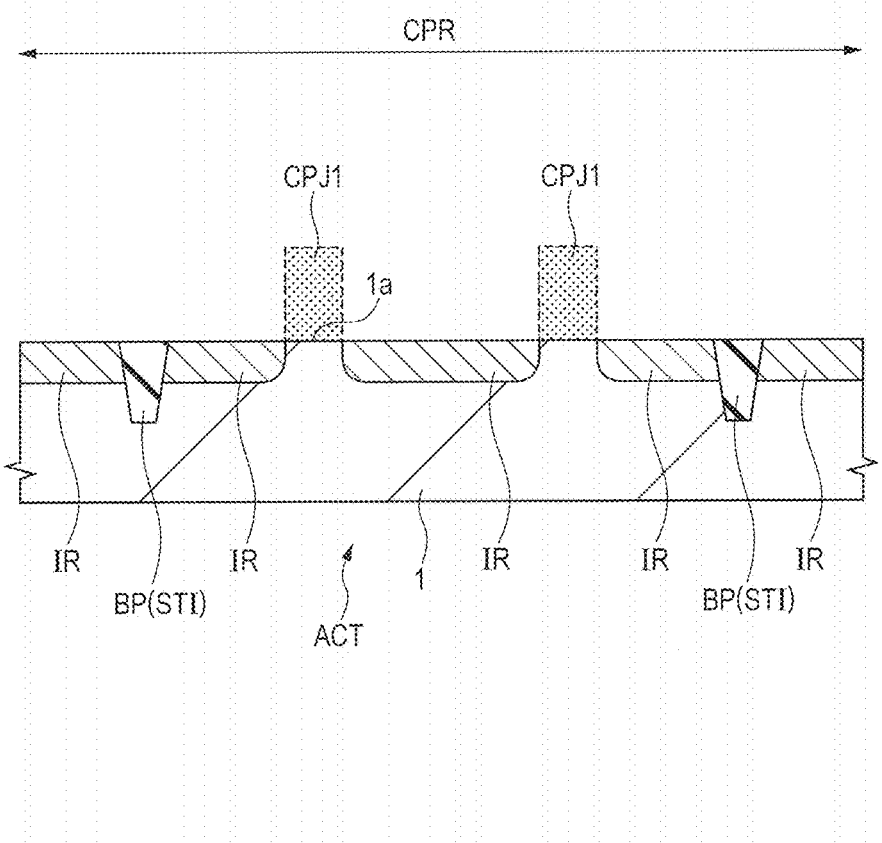
FIG. 26 is a cross-sectional view along the line B-B in FIG. 25A.
Figure 27A:
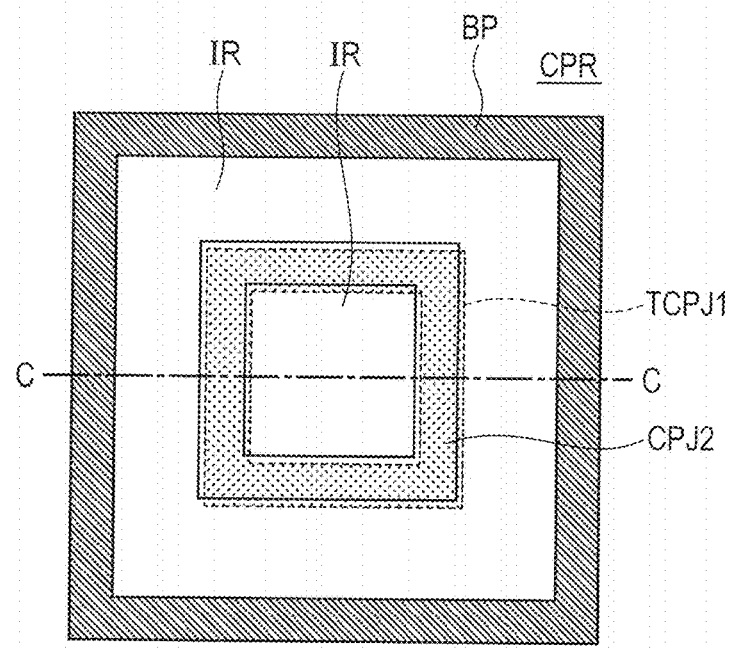
FIG. 27A is a plan view of the inspection pattern formation region in the semiconductor device during the manufacturing process thereof, which is subsequent to FIGS. 25A and 25B.
Figure 27B:
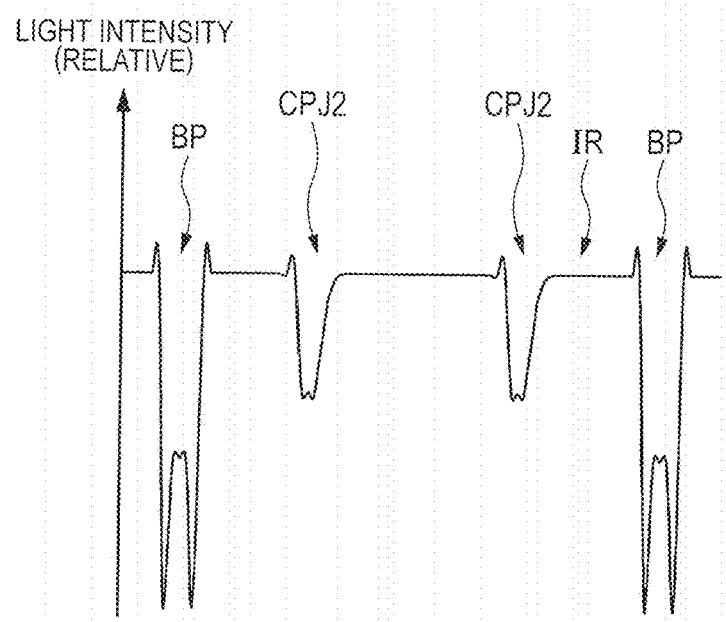
FIG. 27B is a view showing a light intensity along the line C-C.

Before describing a method of manufacturing the semiconductor device in the present embodiment, a description will be given of a studied example studied by the present inventors. FIG. 24A is a plan view of an inspection pattern formation region in a semiconductor device in the studied example during the manufacturing process thereof. FIG. 24B is view showing a light intensity along the line A-A in FIG. 24A. FIG. 25A is a plan view of the inspection pattern formation region in the semiconductor device during the manufacturing process thereof, which is subsequent to FIGS. 24A and 24B. FIG. 25B is a view showing a light intensity along the line B-B in FIG. 25A. FIG. 26 is a cross-sectional view along the line B-B in FIG. 25A. FIG. 27A is a plan view of the inspection pattern formation region in the semiconductor device during the manufacturing process thereof, which is subsequent to FIGS. 25A and 25B. FIG. 27B is a view showing a light intensity along the line C-C in FIG. 27A. Each of FIGS. 24B, 25B, and 27B shows a light intensity when a reference pattern BP, inspection patterns CPJ1 and CPJ2, and an inspection pattern trace TCPJ1 are subjected to image recognition using an optical microscope, in which, e.g., brightness is higher on the upper side and lower on the lower side.

Each of FIGS. 24A, 25A, and 27A is a plan view of each of the inspection pattern formation regions CPR for detecting an amount of misalignment of a mask layer for ion implantation. In each one of the inspection pattern formation regions CPR, the inspection patterns CPJ1 and CPJ2 are formed in succession. Since the individual inspection pattern formation regions CPR are disposed beside the respective sides (four sides) of the semiconductor substrate 1 on a one-to-one basis, in the inspection pattern formation regions CPR disposed beside the four sides, the inspection patterns CPJ1 and CPJ2 are simultaneously formed. The following will describe one of the inspection pattern formation regions CPR.

FIG. 24A shows the reference pattern (alignment target layer) BP and the inspection pattern (to-be-aligned layer) CPJ1 which are formed in the inspection pattern formation region CPR. The reference pattern (alignment target layer) BP is formed of the isolation film STI which is an insulating film such as a silicon dioxide film embedded in the trench formed in the main surface 1a of the semiconductor substrate 1. In plan view, the reference pattern BP has, e.g., a frame-like shape. The inspection pattern (to-be-aligned layer) CPJ1 is made of a photoresist layer formed over the main surface 1a of the semiconductor substrate 1 and has a frame-like shape in plan view. The size of the inspection pattern CPJ1 is smaller than the size of the reference pattern BP. The inspection pattern CPJ1 is disposed inside the reference pattern BP.

As shown in FIG. 24B, the light intensity is progressively lower (darker) in the main surface 1a of the semiconductor substrate 1 made of monocrystalline silicon, the photoresist layer forming the inspection pattern CPJ1, and the isolation film STI forming the reference pattern BP in this order. However, the light intensity is only exemplary. The order of the light intensities (tones) in the semiconductor substrate 1, the reference pattern BP, the inspection pattern CPJ1, and the like is not limited and may also be, e.g., reversed.

FIGS. 24A and 24B show a state before a p- or n-type impurity is ion-implanted into the main surface 1a of the semiconductor substrate 1.

FIGS. 25A and 25B show the subsequent state where the inspection pattern CPJ1 is removed after the ion implantation. FIG. 26 is a cross-sectional view along the line B-B in FIG. 25A. As shown in FIG. 26, in the main surface 1a of the semiconductor substrate 1 except for the inspection pattern CPJ1 and the reference pattern BP (isolation film STI), an impurity implantation region IR is formed. When the dose of the ion-implanted impurity is, e.g., not less than $1 \times 10^{15}$ cm$^{-2}$, the impurity implantation region IR is made of an amorphous layer. On the other hand, the main surface 1a covered with the inspection pattern CPJ1 remains as a monocrystalline silicon layer. Consequently, as shown in FIG. 25A, the inspection pattern trace TCPJ1 was observed in the region where the inspection pattern CPJ1 had been present.

As shown in FIG. 25B, an optical constant (e.g., refractive index or extinction coefficient) of the impurity implantation region IR made of the amorphous layer is different from the optical constant of the monocrystalline silicon layer. As a result, the light intensity of the impurity implantation region IR increases so that the inspection pattern trace TC remaining as the monocrystalline silicon layer appears relatively dark.

FIG. 27A shows the state where the inspection pattern CPJ2 made of the photoresist layer is formed. The inspection pattern CPJ2 is formed at a position equal to that of the inspection pattern CPJ1 to have a size equal to that of the inspection pattern CPJ1. However, in the event of a misalignment, the inspection pattern CPJ2 is formed at a position displaced from the position of the inspection pattern trace TCPJ1. As shown in FIG. 27A, the inspection pattern CPJ2 is formed to be displaced diagonally to the upper left of the inspection pattern trace TCPJ1. As a result, to the right of and beneath the inspection pattern CPJ2, the inspection pattern trace TCPJ1 is exposed.

The light intensity along the line C-C in FIG. 27A shows a phenomenon in which, as shown in FIG. 27B, the light intensity decreases on the right side of the inspection pattern CPJ2 under the influence of the inspection pattern trace TCPJ1 so that, e.g., the width of the inspection pattern CPJ2 is detected to be wider than the true width thereof. That is, it can be seen that the inspection pattern CPJ2 was erroneously detected and the detection accuracy of the inspection pattern CPJ2 deteriorated.

It can also be seen that, particularly when the dose in the ion implantation for forming the impurity implantation regions IR is higher than $1 \times 10^{15}$ cm$^{-2}$, the inspection pattern trace TCPJ1 is recognized and the frequency of erroneous detection of the inspection pattern CPJ2 is high and, when the dose is lower than $1 \times 10^{15}$ cm$^{-2}$, the frequency of erroneous detection is low.

A method of manufacturing the semiconductor device in the present embodiment, which will be described below, prevents erroneous detection of an inspection pattern and improves the detection accuracy of the inspection pattern.

Figure 2:
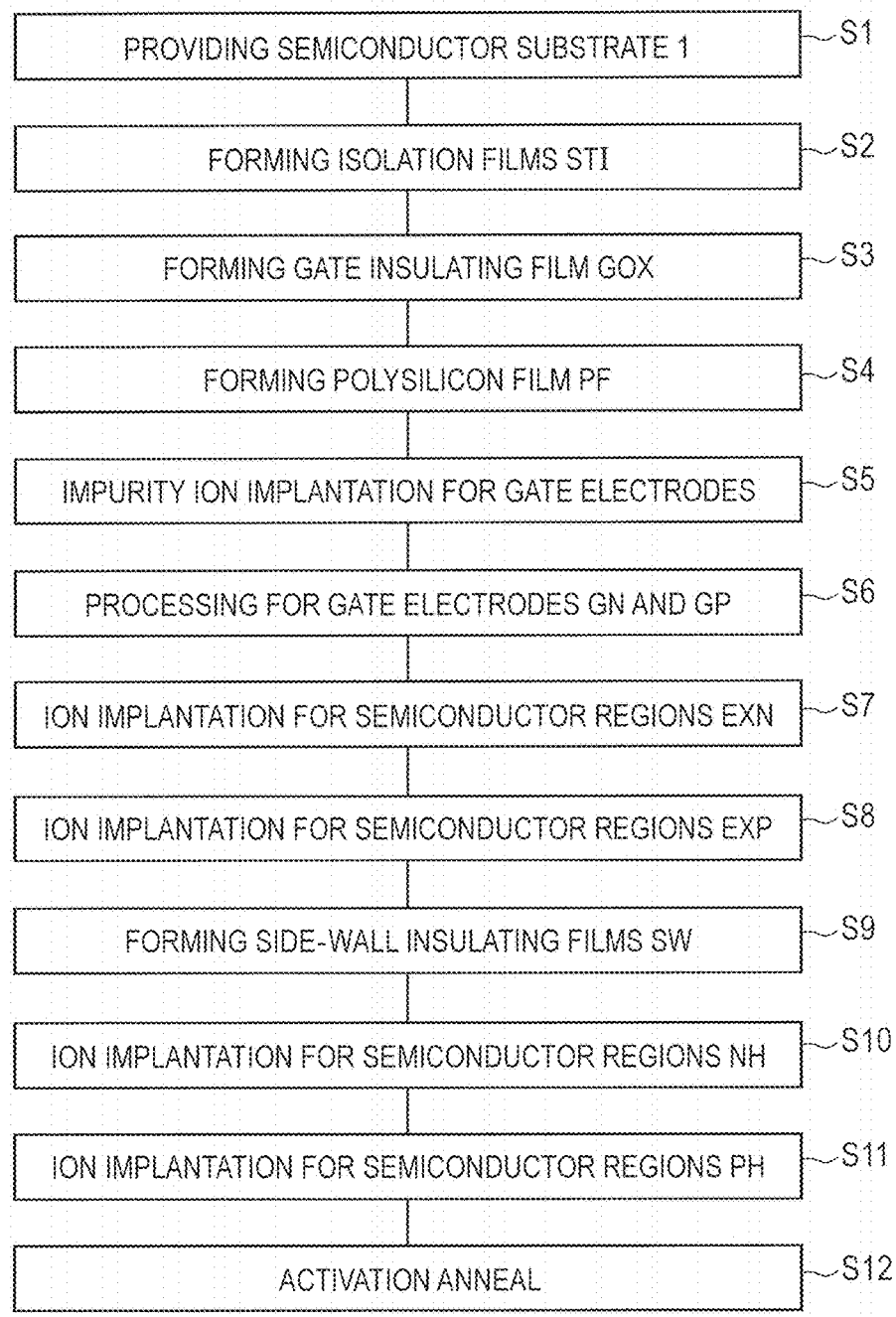
FIG. 2 is a process flow chart showing the manufacturing process of the semiconductor device in the embodiment.
Figure 13:
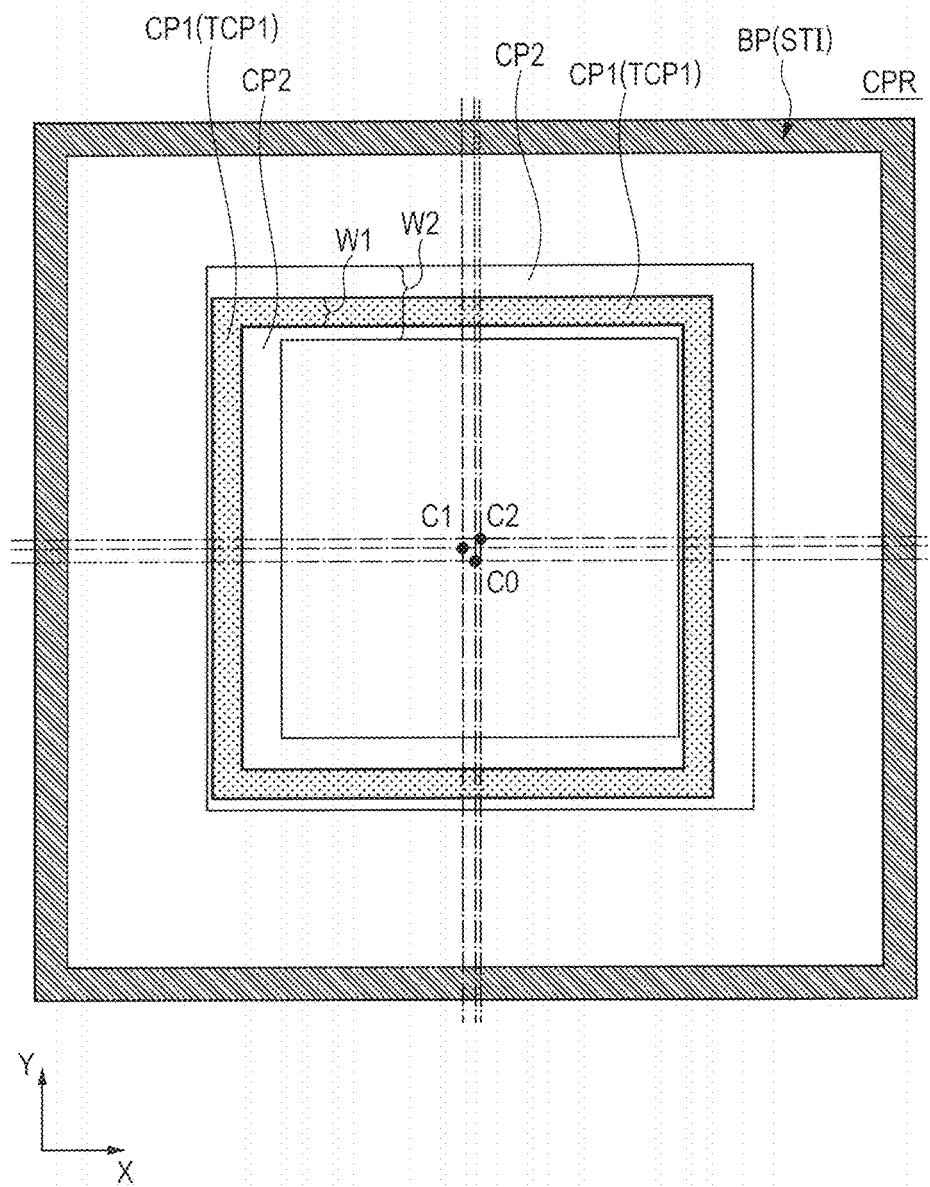
FIG. 13 is a plan view of an inspection pattern formation region in the semiconductor device in the embodiment.
Figure 14:
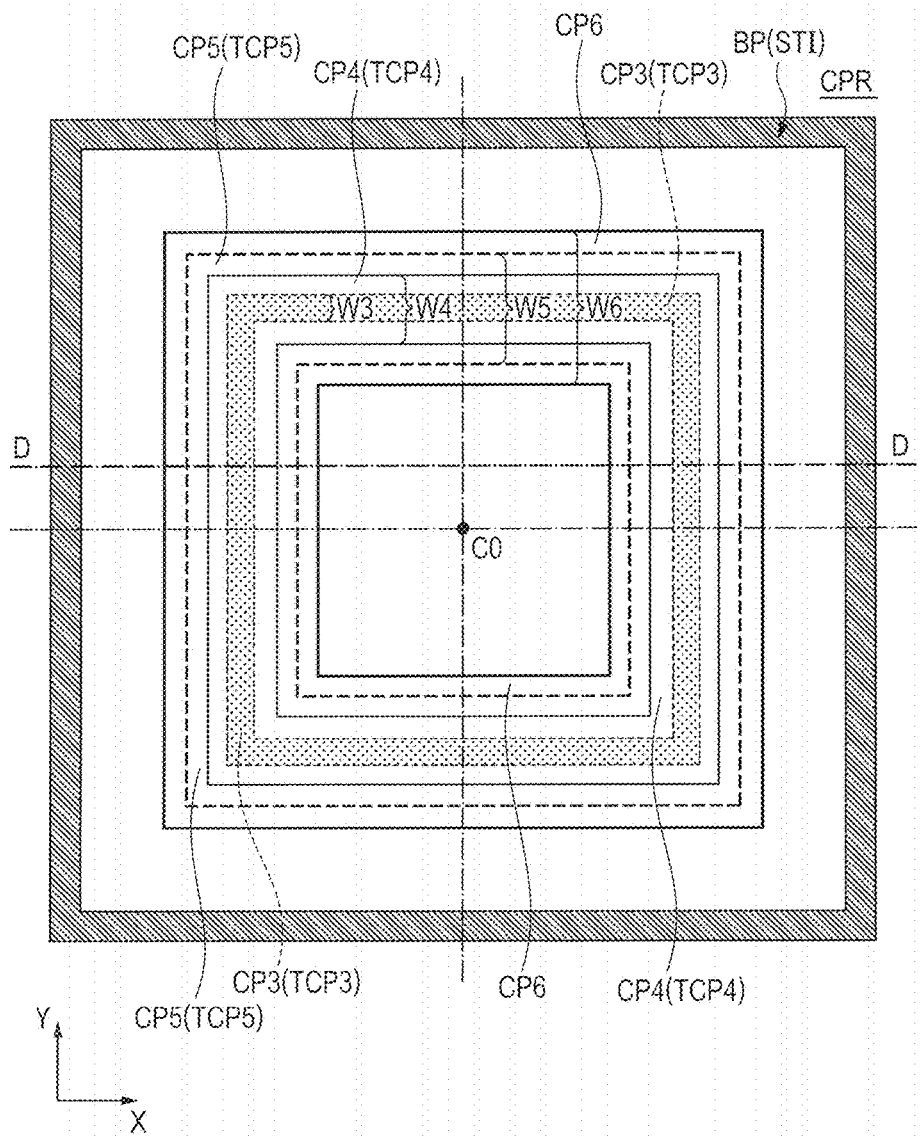
FIG. 14 is a plan view of the inspection pattern formation region in the semiconductor device in the embodiment.
Figure 15A:
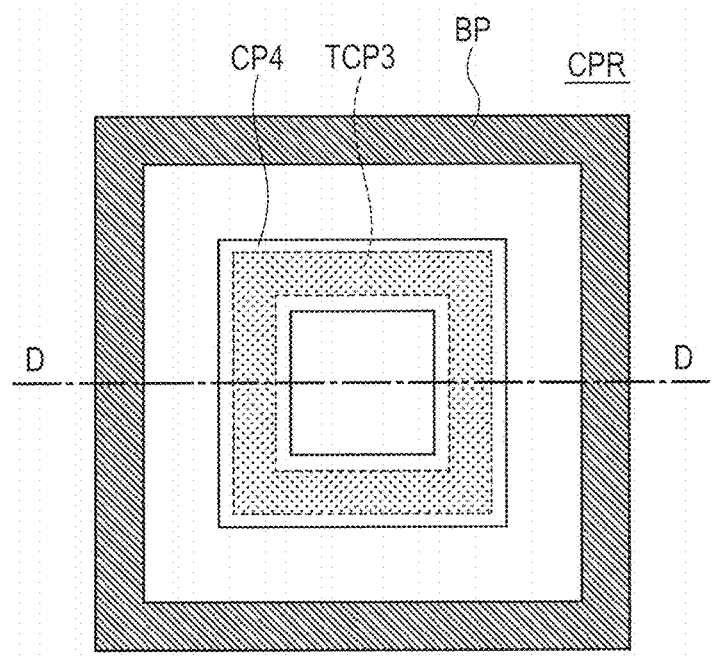
FIG. 15A is a plan view of the inspection pattern formation region in the semiconductor device in the embodiment during the manufacturing process thereof and FIG. 15B is a view showing a light intensity along the line D-D.
Figure 15B:
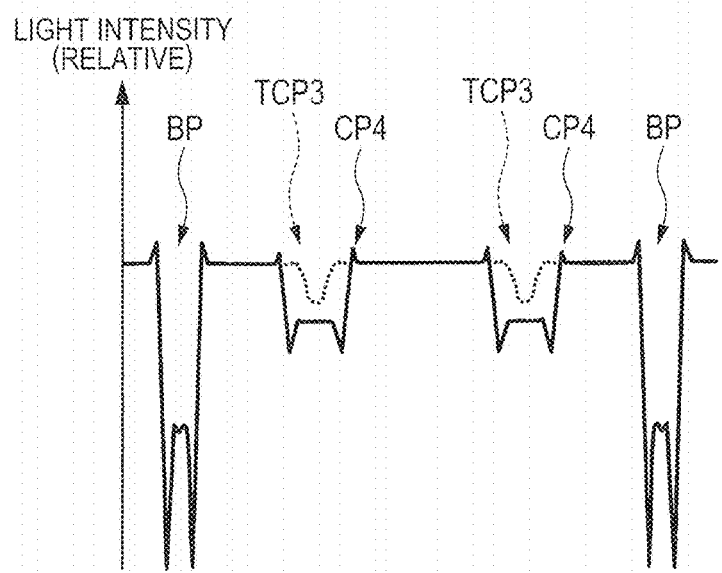

FIG. 2 is a process flow chart showing the manufacturing process of the semiconductor device in the present embodiment. FIGS. 3 to 12 are cross-sectional views of the semiconductor device in the present embodiment during the manufacturing process thereof. FIG. 13 is a plan view of the inspection pattern formation region in the semiconductor device in the present embodiment. FIG. 14 is a plan view of the inspection pattern formation region in the semiconductor device in the present embodiment. FIG. 15A is a plan view of the inspection pattern formation region during the manufacturing process of the semiconductor device in the present embodiment. FIG. 15B is a view showing a light intensity along the line D-D in FIG. 15A. FIG. 16 is a plan view of the inspection pattern formation region in the semiconductor device in the present embodiment. FIG. 17 is a process flow chart of a part of the manufacturing process of the semiconductor device in the present embodiment. Note that, in FIG. 13, for the improved clarity of the sizes of the two inspection patterns CP1 and CP2 and the positional relationship therebetween, the two inspection patterns CP1 and CP2 are shown in the drawing. Likewise, in FIGS. 14 and 16, for the improved clarity of the sizes of four inspection patterns CP3, CP4, CP5, and CP6 and the positional relationship thereamong, the four inspection patterns CP3, CP4, CP5, and CP6 are shown in each of the drawings. FIG. 14 shows the case where the inspection patterns CP3, CP4, CP5, and CP6 are not misaligned with the reference pattern BP. FIG. 16 shows the case where the inspection patterns CP3 CP4, CP5, and CP6 are misaligned with the reference pattern BP in a diagonally top left direction along the paper sheet with the drawing.

Using FIGS. 2 to 17, a method of manufacturing the re-channel MISFETs QN, the p-channel MISFETs QP, the reference patterns, and the inspection patterns will be described. Note that the n-channel MISFETs QN are formed in an n-channel MISFET formation region NTR, the p-channel MISFETs QP are formed in a p-channel MISFET formation region PTR, and the inspection patterns are formed in the inspection pattern formation region CPR.

The step of "Providing Semiconductor Substrate 1" (S1) and the step of "Forming Isolation Films STI" (S2) each shown in FIG. 2 are performed.

Figure 3:
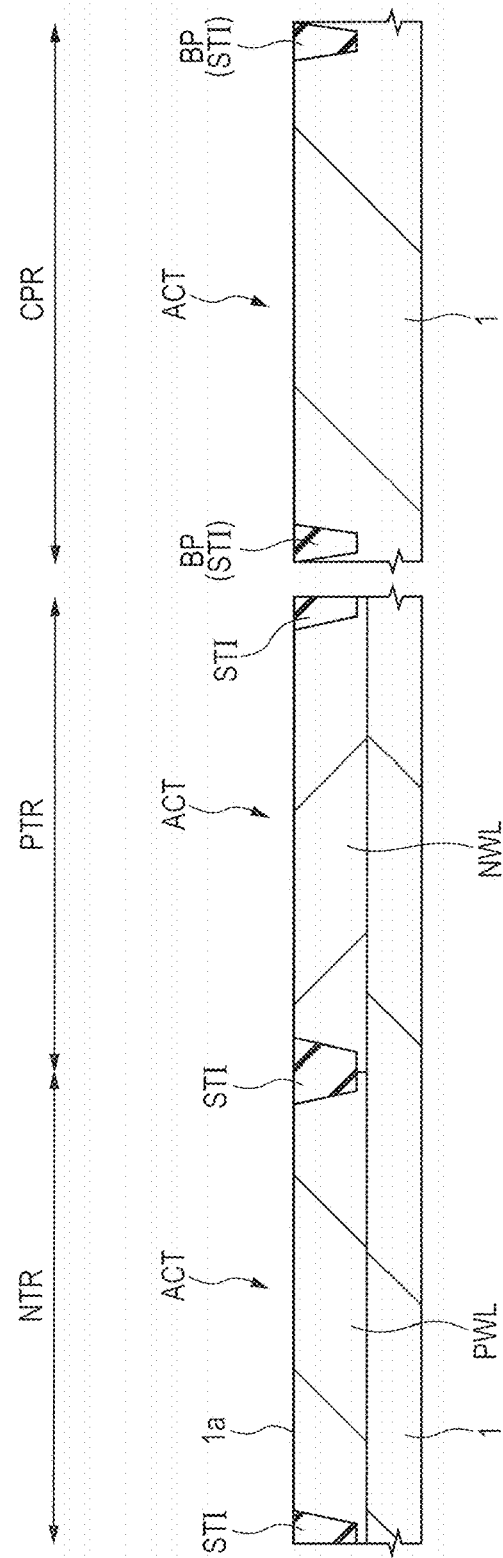
FIG. 3 is a cross-sectional view of the semiconductor device in the embodiment during the manufacturing process thereof.

First, as shown in FIG. 3, the semiconductor substrate 1 made of monocrystalline silicon in which a p-type impurity such as boron (B) is introduced is provided. At this time, the semiconductor substrate 1 is in the form of a semiconductor wafer having a generally disc-like shape. Next, in the main surface 1a of the semiconductor substrate 1, the isolation films STI are formed. Using a photolithographic technique and an etching technique, isolation trenches are formed in the main surface 1a of the semiconductor substrate 1. Then, over the semiconductor substrate 1, an insulating film such as a silicon dioxide film is formed so as to be embedded in the isolation trenches. Then, by a chemical mechanical polishing method (CMP), the unneeded insulating film formed over the semiconductor substrate 1 is removed. Thus, the isolation films (isolation regions) STI made of the insulating film such as a silicon dioxide film which is embedded only in the isolation trenches can be formed.

As a result of forming the isolation films STI, in each of the n-channel MISFET formation region NTR, the p-channel MISFET formation region PRT, and the inspection pattern formation regions CPR, the active regions ACT peripherally surrounded by the isolation films STI are formed.

In each of the inspection pattern formation region CPR, the isolation films STI serve as the reference pattern (alignment target layer) BP having a rectangular frame-like shape (frame shape) in plan view, as shown in FIGS. 13, 14, 15A, and 16.

Next, an impurity is introduced into the active regions ACT isolated by the isolation regions STI to form wells. For example, in the n-channel MISFET formation region NTR included in the active region ACT, a p-type well PWL is formed and, in the p-channel MISFET formation region PTR included in the active region ACT, an n-type well NWL is formed. The p-type well PWL is formed by introducing a p-type impurity such as, e.g., boron into the semiconductor substrate 1 by an ion implantation method. Likewise, the n-type well NWL is formed by introducing an n-type impurity such as, e.g., phosphorus (P) or arsenic (As) into the semiconductor substrate 1 by an ion implantation method.

The present embodiment shows an example in which neither the p-type well PWL nor the n-type well NWL is formed in the inspection pattern formation region CPR. However, either one of the p-type well PWL and the n-type well NWL may also be formed.

Next, the step of "Forming Gate Insulating Film GOX" (S3) and the step of "Forming Polysilicon Film PF" (S4) which are shown in FIG. 2 are performed.

Figure 4:
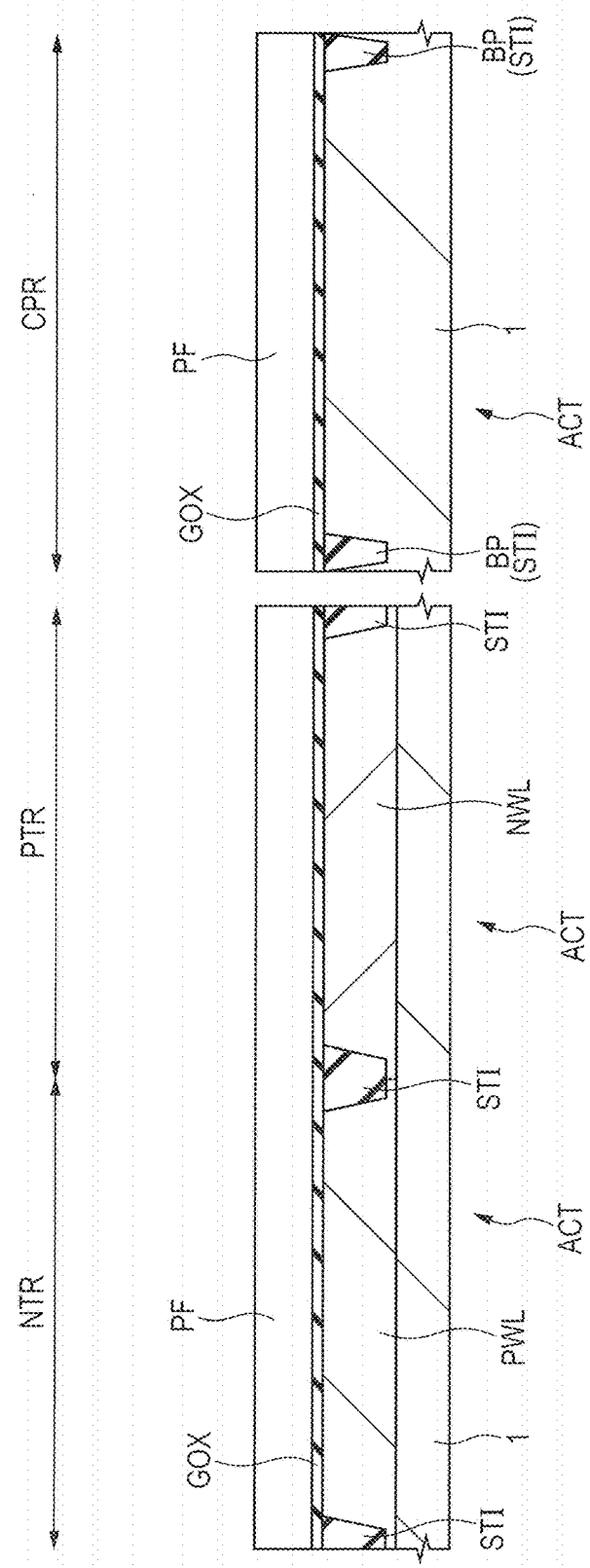
FIG. 4 is a cross-sectional view of the semiconductor device during the manufacturing process thereof, which is subsequent to FIG. 3.

As shown in FIG. 4, over the semiconductor substrate 1, a gate insulating film GOX is formed. The gate insulating film GOX is formed of, e.g., a silicon dioxide film and formed by, e.g., thermally oxidizing the main surface 1a of the semiconductor substrate 1. However, the gate insulating film GOX is not limited to a silicon dioxide film and can variously be changed. For example, the gate insulating film GOX may also be a silicon oxynitride film (SiON). The gate insulating film GOX may also be formed of, e.g., a high-dielectric-constant film having a dielectric constant higher than that of a silicon dioxide film. As the high-dielectric-constant film, e.g., a hafnium oxide film (HfO$_2$ film) as one of hafnium oxides is used. However, instead of the hafnium oxide film, another hafnium-based insulating film such as a HfAlO film (hafnium aluminate film), a HfON film (hafnium oxynitride film), a HfSiO film (hafnium silicate film), or a HfSiON film (hafnium silicon oxynitride film) can also be used. It is also possible to use a hafnium-based insulating film obtained by introducing an oxide such as tantalum oxide, niobium oxide, titanium oxide, zirconium oxide, lanthanum oxide, or yttrium oxide into such a hafnium-based insulating film.

The gate insulating film GOX in the n-channel MISFET formation region NTR may also have a film thickness different from that of the gate insulating film GOX in the p-channel MISFET formation region PTR, a film quality different from that of the gate insulating film GOX, or a film thickness and a film quality which are different from those of the gate insulating film GOX.

Next, the polysilicon film (silicon film) PF is formed over the gate insulating film GOX. The polysilicon film PF can be formed using, e.g., a CVD method. The polysilicon film PF formed at this time is formed of a silicon film in a poly-crystalline state.

Next, the step of "Impurity Ion Implantation for Gate Electrodes" (S5) shown in FIG. 2 is performed. The step of "Impurity Ion Implantation for Gate Electrodes" (S5) includes two photolithographic steps of forming photoresist layers PR1 and PR2 which are used when an n-type impurity and a p-type impurity are ion-implanted into the polysilicon film PF.

Figure 5:
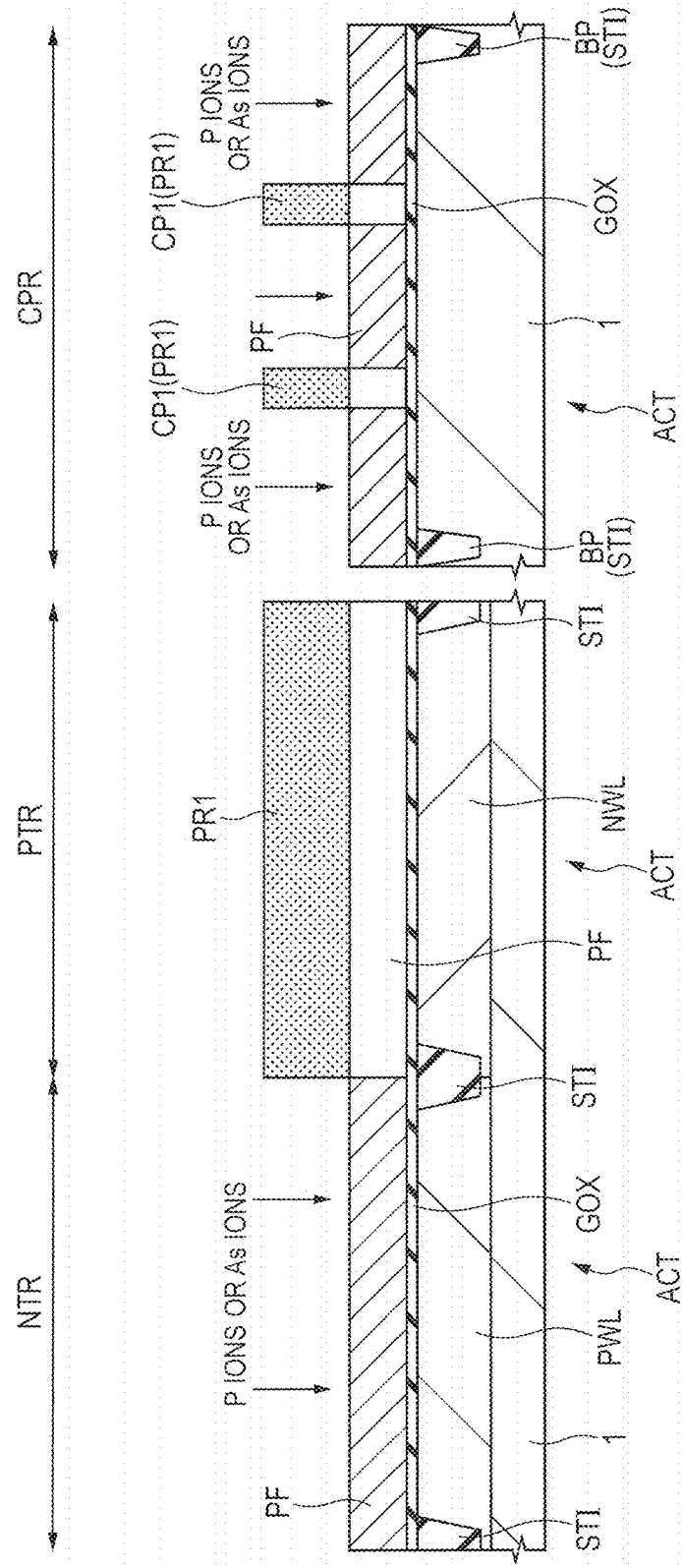
FIG. 5 is a cross-sectional view of the semiconductor device during the manufacturing process thereof, which is subsequent to FIG. 4.

As shown in FIG. 5, a photoresist layer PR1 is formed which covers the p-channel MISFET formation region PTR and exposes the n-channel MISFET formation region NTR. At this time, in the inspection pattern formation region CPR, the inspection patterns (to-be-aligned layers) CP1 made of the photoresist layer PR1 are formed. Then, using the photoresist layer PR1 as a mask, into the polysilicon film PF exposed from the photoresist layer PR1, an n-type impurity such as, e.g., phosphorus ions or arsenic ions is ion-implanted at a dose of 1 to $5 \times 10^{15}$ cm$^{-2}$. That is, in the polysilicon film in the n-channel MISFET formation region NTR and in the polysilicon film PF exposed from the inspection patterns CP1 in the inspection pattern formation region CPR, impurity implantation regions are formed. In the impurity ion implantation regions, amorphous silicon layers are formed while, in the region in which the n-type impurity is not implanted, the polycrystalline silicon layer remains.

Before the ion implantation of the n-type impurity is performed, as shown in FIG. 17, using the inspection patterns CP1, the step of "Measuring Amount of Misalignment" of the inspection pattern CP1 with respect to the reference pattern BP (S23) is performed. When the amount of misalignment falls within or below a predetermined tolerable range, the step of "Ion Implantation" of the n-type impurity (S25) is performed. However, when the amount of misalignment exceeds the tolerable range, the step of "Removing Photoresist Layer PR1 and Inspection Patterns CP1" (S24) is performed, and then the step of "Forming Photoresist Layer PR1 and Inspection Patterns CP1" (S22) and the step of "Measuring Amount of Misalignment" (S23) are performed again. Thus, the removal of the photoresist layer PR1, the formation of the photoresist layer PR1, and the measurement of the amount of misalignment are repeatedly performed until the amount of misalignment falls within or below the tolerable range. Then, after the step of "Ion Implantation" (S25) is completed, the step of "Removing Photoresist Layer PR1 and Inspection Patterns PC1" (S26) is performed. Note that, since the process flow shown in FIG. 17 is similarly performed even in an ion implantation other than the foregoing, "PR(n)" is used to denote the photoresist layer and "(n)" is used to denote the inspection pattern.

Also, as shown in FIG. 13, each of the inspection patterns CP1 formed in the inspection pattern formation region CPR has a rectangular frame-like shape (frame shape). Also, in the step of "Measuring Amount of Misalignment" (S23) shown in FIG. 17, using, e.g., an optical microscope, the reference pattern BP and the inspection patterns CP1 are subjected to image recognition and the amount of misalignment of a center point C1 of each of the inspection patterns CP1 with respect to a center point C0 of the reference pattern BP is measured. Note that, in FIG. 13, the inspection pattern CP2 formed in the subsequent step is also shown in combination.

Figure 6:
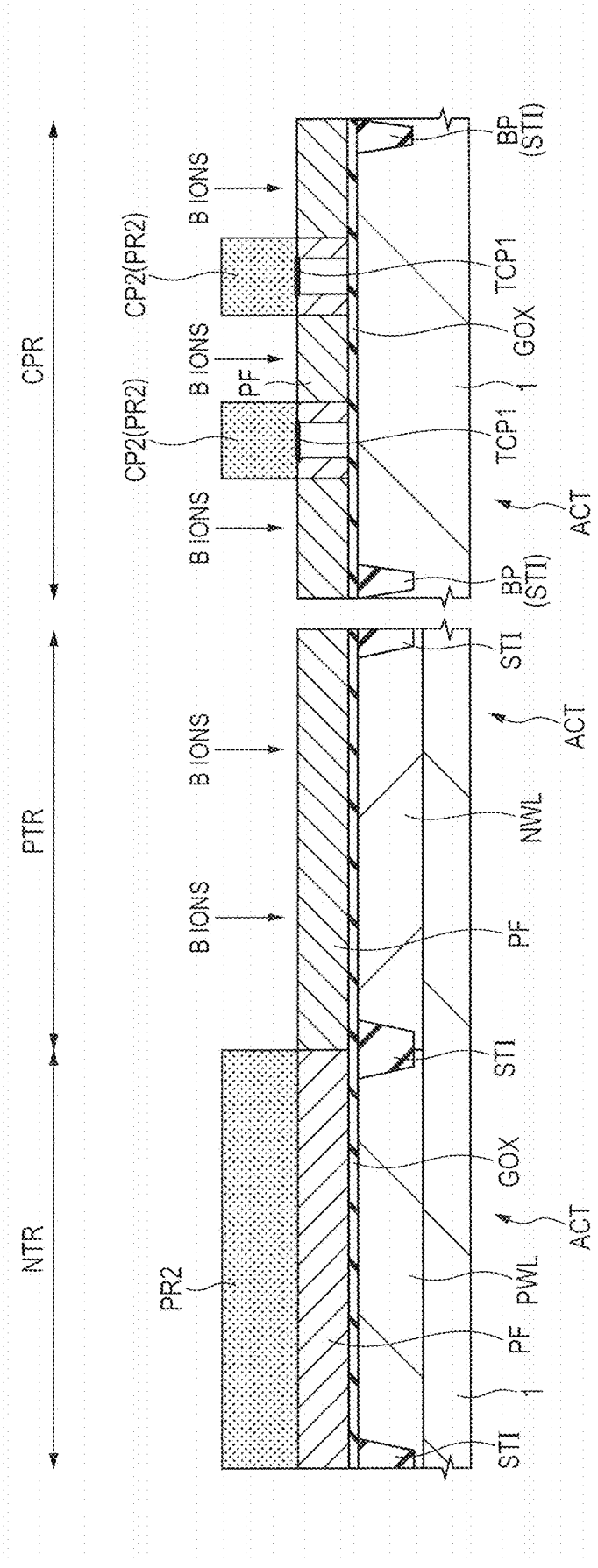
FIG. 6 is a cross-sectional view of the semiconductor device during the manufacturing process thereof, which is subsequent to FIG. 5.

Next, as shown in FIG. 6, the photoresist layer PR2 is formed which covers the n-channel MISFET formation region NTR and exposes the p-channel MISFET formation region PTR. At this time, in the inspection pattern formation region CPR, the inspection patterns (to-be-aligned layers) CP2 made of the photoresist layer PR2 are formed. Then, using the photoresist layer PR2 as a mask, into the polysilicon film PF exposed from the photoresist layer PR2, a p-type impurity such as, e.g., boron ions is ion-implanted at a dose of 1 to $5 \times 10^{15}$ cm$^{-2}$. That is, the p-type impurity is implanted into the polysilicon film PF in the p-channel MISFET formation region PTR and into the polysilicon film PF exposed from the inspection patterns CP2 in the inspection pattern formation region CPR to form the impurity implantation regions therein.

Before the ion implantation of the p-type impurity is performed, as shown in FIG. 17, using the inspection patterns CP2, the step of "Measuring Amount of Misalignment" of each of the inspection patterns CP2 with respect to the reference pattern BP (S23) is performed. When the amount of misalignment falls within or below a predetermined tolerable range, the step of "Ion Implantation" of the p-type impurity (S25) is performed. Note that, when the amount of misalignment exceeds the tolerable range, the removal of the photoresist layer PR2, the formation of the photoresist layer PR2, and the measurement of the amount of misalignment are repeatedly performed until the amount of misalignment falls within or below the tolerable range. After the step of "Ion Implantation" (S25) is completed, the step of "Removing Photoresist Layer PR2 and Inspection Patterns CP2" (S26) is performed.

As shown in FIG. 13, each of the inspection patterns CP2 has a rectangular frame-like shape (flame shape). In the step of "Measuring Amount of Misalignment" (S23) shown in FIG. 17, e.g., the amount of misalignment of a center point C2 of each of the inspection patterns CP2 with respect to the center point C0 of the reference pattern BP is measured. As shown in FIG. 13, it is important herein that the inspection pattern CP2 completely covers the region where the inspection pattern CP1 was formed. The inspection pattern CP1 has been removed before the formation of the inspection pattern CP2 but, as described above, the region where the inspection pattern CP1 was formed is image-recognized as the inspection pattern trace TCP1. If the inspection pattern trace TCP1 is exposed around the inspection pattern CP2, each of the exposed inspection pattern trace TCP1 and the inspection pattern CP2 is undesirably image-recognized as the inspection pattern CP2. As a result, the center point C2 of the inspection pattern CP2 is erroneously detected.

To prevent this, as shown in FIGS. 6 and 13, it is important to provide a structure in which each of the inspection patterns CP2 is larger than each of the inspection patterns CP1 and can completely covers the inspection pattern trace TCP1. That is, the inspection pattern CP2 has a pattern (two-dimensional shape and cross-sectional shape) which covers the entire region where the inspection pattern CP1 was formed and extends continuously therefrom to the region (region where the n-type impurity is implanted) exposed from the inspection pattern CP1. Accordingly, a width (referred to as frame width) W2 of the frame portion of the inspection pattern CP2 needs to be set larger than at least a frame width W1 of the inspection pattern CP1 around the entire periphery thereof (W2>W1). When α1 is a mask alignment tolerance for the photoresist layer PR1 and α2 is a mask alignment tolerance for the photoresist layer PR2 in the photolithographic step, for the alignment of each of the inspection patterns CP1 and CP2 with respect to the reference pattern BP, it is important for the frame width W2 of the inspection pattern CP2 to be larger than the frame width W1 of the inspection pattern CP1 by 2α or more (W2≥W1+α1+α2).

By thus providing the structure in which each of the inspection patterns CP2 is larger than each of the inspection patterns CP1 and the inspection pattern trace TCP1 is completely covered with the inspection pattern CP2, it is possible to prevent erroneous detection of the inspection pattern CP2 and improve the detection accuracy of the inspection pattern CP2. This can consequently prevent reformation of the photoresist layer PR2 resulting from erroneous detection and thus reduce manufacturing cost and a manufacturing time.

Note that the description has been given using the example in which the step of ion-implanting the n-type impurity is performed before the step of ion-implanting the p-type impurity. However, the order in which the step of ion-implanting the n-type impurity and the step of ion-implanting the p-type impurity are performed may also be reversed. In that case, in the step of ion-implanting the p-type impurity, the inspection patterns CP1 are used and, in the step of ion-implanting the n-type impurity, the inspection patterns CP2 are used.

Next, the step of "Processing for Gate Electrodes GN and GP" (S6) shown in FIG. 2 is performed.

Figure 7:
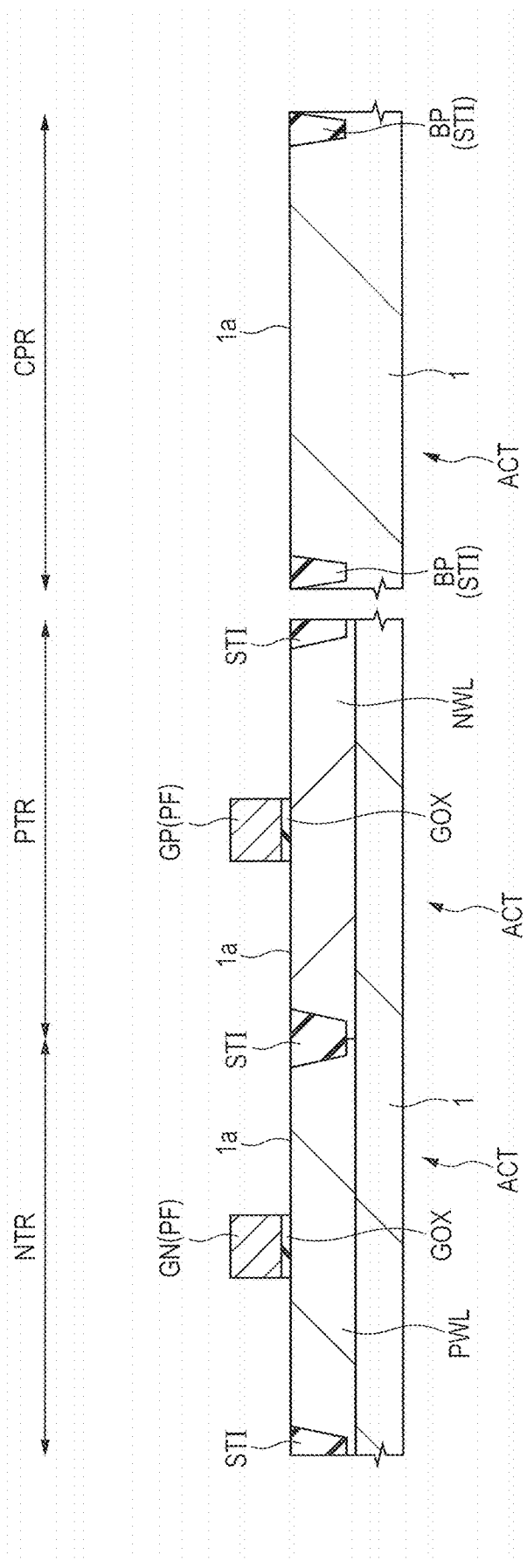
FIG. 7 is a cross-sectional view of the semiconductor device during the manufacturing process thereof, which is subsequent to FIG. 6.

As shown in FIG. 7, by patterning the polysilicon film PF, the gate electrode GN is formed over the main surface 1a of the semiconductor substrate 1 via the gate insulating film GOX in the n-channel MISFET formation region NTR and the gate electrode GP is formed over the main surface 1a of the semiconductor substrate 1 via the gate insulating film GOX in the p-channel MISFET formation region PTR. Note that, in this process step, the polysilicon film PF and the gate insulating film GOX are removed from the inspection pattern formation region CPR so that the main surface 1a of the semiconductor substrate 1 is exposed.

Next, the step of "Ion Implantation for Semiconductor Regions EXN" (S7) shown in FIG. 2 is performed.

Figure 8:
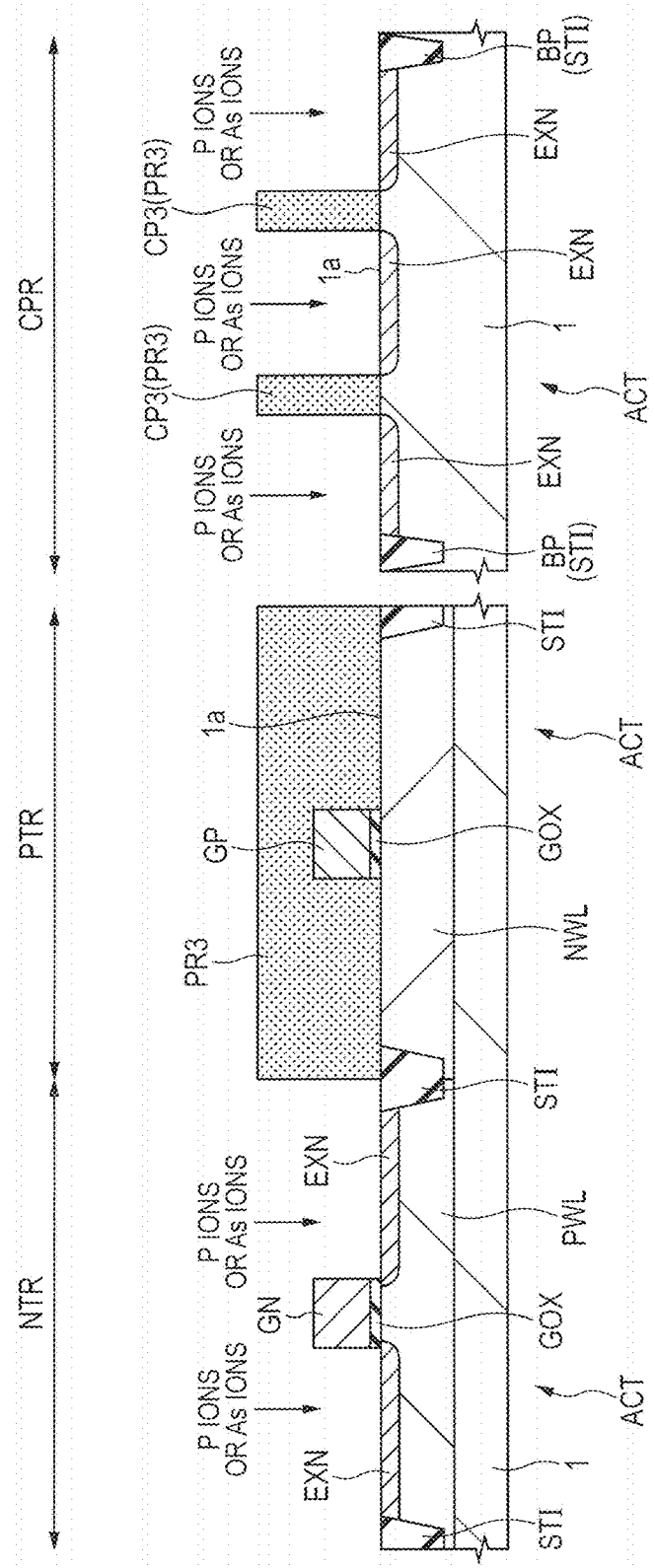
FIG. 8 is a cross-sectional view of the semiconductor device during the manufacturing process thereof, which is subsequent to FIG. 7.

As shown in FIG. 8, a photoresist layer PR3 is formed which covers the p-channel MISFET formation region PTR and exposes the n-channel MISFET formation region NTR. At this time, in the inspection pattern formation region CPR, the inspection patterns (to-be-aligned layers) CP3 made of the photoresist layer PR3 are formed. Then, using the photoresist layer PR3 as a mask, into the main surface 1a of the semiconductor substrate 1 exposed from the photoresist layer PR3, an n-type impurity such as, e.g., phosphoric ions or arsenic ions is implanted at a dose of 1 to $5 \times 10^{15}$ cm$^{-2}$ to form the semiconductor regions EXN. The semiconductor regions EXN are formed in the main surface 1a of the semiconductor substrate 1 where the gate electrode GN and the isolation films STI are not present by self-alignment with the gate electrode GN and the isolation films STI. However, the semiconductor regions EXN are completed through activation anneal described later and are impurity diffusion regions at this process stage.

An n-type impurity is implanted into the semiconductor substrate 1 located in the n-channel MISFET formation region NTR and in the area of the inspection pattern formation region CPR which is exposed from the inspection patterns CP3. In the areas of the n-channel MISFET formation region NTR and the inspection pattern formation region SPR in which the n-type impurity is implanted, the main surface 1a of the semiconductor substrate 1 which is made of monocrystalline silicon is amorphized to form amorphous silicon layers. In the area which is covered with the photoresist layer PR3 and in which the n-type impurity is not implanted, the monocrystalline silicon layer remains. That is, the area of the inspection pattern formation region CPR which is covered with the inspection pattern CP3 is made of monocrystalline silicon while, in the area of the inspection pattern formation region CPR which is exposed from the inspection pattern CP3, the amorphous layer is formed.

Before the ion implantation of the n-type impurity is performed herein, as shown in FIG. 17, using the inspection pattern CP3 formed of the photoresist layer PR3, the step of "Measuring Amount of Misalignment" of each of the inspection patterns CP3 with respect to the reference pattern BP (S23) is performed. When the amount of misalignment falls within or below a predetermined tolerable range, the step of "Ion Implantation" of an n-type impurity (S25) is performed. Note that, when the amount of misalignment exceeds the tolerable range, the removal of the photoresist layer PR3, the formation of the photoresist layer PR3, and the measurement of the amount of misalignment are repeatedly performed until the amount of misalignment falls within or below the tolerable range. Then, after the step of "Ion Implantation" (S25) is completed, the step of "Removing Photoresist Layer PR3 and Inspection Patterns CP3" (S26) is performed. That is, the photoresist layer PR3 and the inspection pattern CP3 each serving as a mask for the ion implantation step are removed by asking treatment. Then, in the subsequent ion implantation step also, the flow shown in FIG. 17 is implemented.

As shown in FIG. 14, each of the inspection patterns CP3 has a rectangular frame-like shape (frame shape) and also has a frame width W3. Since the polysilicon film PF described above has been removed heretofore, the inspection pattern CP3 is formed over the main surface 1a of the semiconductor substrate 1 made of monocrystalline silicon. Accordingly, it is not particularly necessary to care about, e.g., the size or position of the inspection pattern CP3 relative to the size or position of the inspection pattern CP2. It is sufficient if the inspection pattern CP3 is disposed at a position displaced from the reference pattern BP and does not overlap the reference pattern BP.

Next, the step of "Ion Implantation for Semiconductor Regions EXP" (S8) shown in FIG. 2 is performed.

Figure 9:
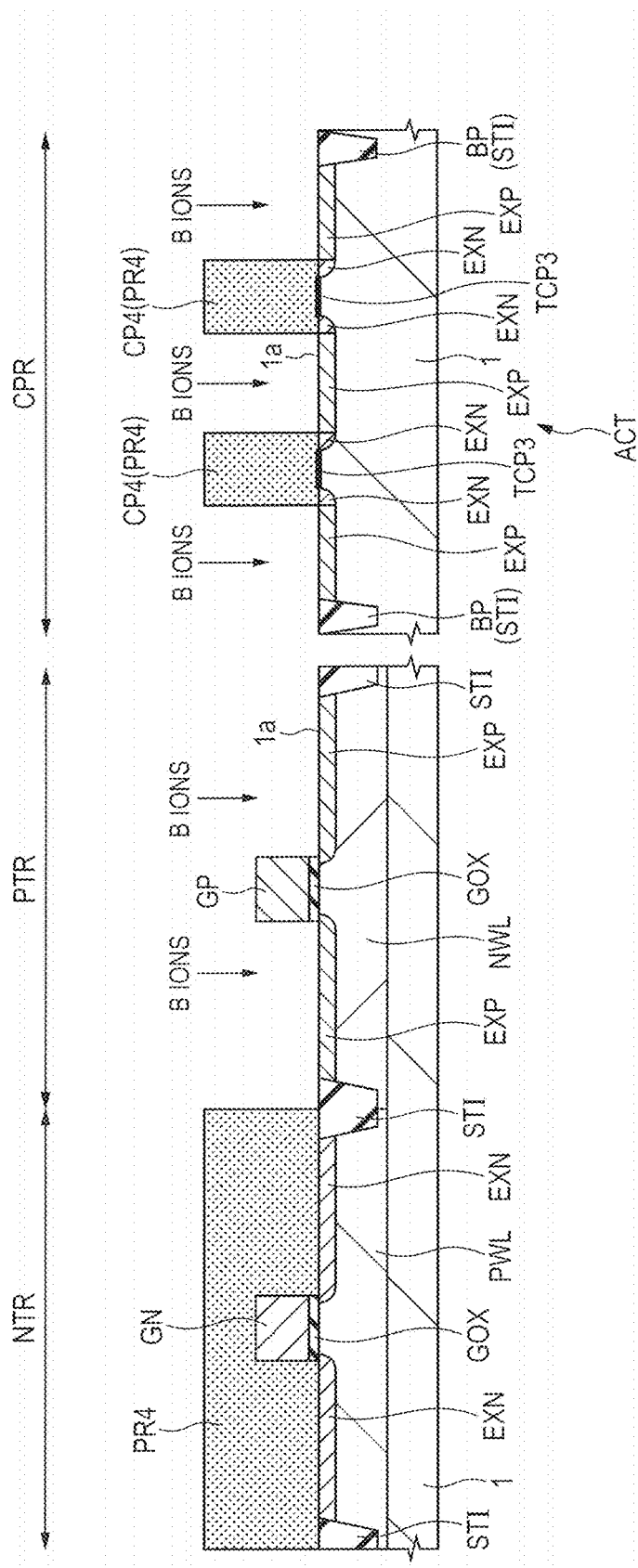
FIG. 9 is a cross-sectional view of the semiconductor device during the manufacturing process thereof, which is subsequent to FIG. 8.

As shown in FIG. 9, a photoresist layer PR4 is formed which covers the n-channel MISFET formation region NTR and exposes the p-channel MISFET formation region PTR. At this time, in the inspection pattern formation region CPR, the inspection patterns (to-be-aligned layers) CP4 made of the photoresist layer PR4 are formed. Then, using the photoresist layers PR4 as a mask, into the main surface 1a of the semiconductor substrate 1 exposed from the photoresist layer PR4, a p-type impurity such as, e.g., boron ions is ion-implanted at a dose of 1 to $5 \times 10^{15}$ cm$^{-2}$ to form the semiconductor regions EXP. The semiconductor regions EXP are formed in the main surface 1a of the semiconductor substrate 1 where the gate electrode GP and the isolation films STI are not present by self-alignment with the gate electrode GP and the isolation films STI. In the inspection pattern formation region CPR, the semiconductor regions EXP are formed in the areas exposed from the inspection patterns CP4. However, the semiconductor regions EXP are completed through the activation anneal described later and are impurity implantation regions at this process stage. In the inspection pattern formation region CPR, amorphous silicon layers are formed in the semiconductor regions EXP or EXN. In the lower part of each of the inspection patterns CP4 where neither the semiconductor region EXP nor the semiconductor region EXN is formed, i.e., in the inspection pattern trace TCP3 (in other words, the region where the inspection pattern CP3 was formed), the main surface 1a of the semiconductor substrate 1 made of monocrystalline silicon remains.

Before the ion implantation of the p-type impurity is performed herein, as shown in FIG. 17, using the inspection patterns CP4, the step of "Measuring Amount of Misalignment" of each of the inspection patterns CP4 with respect to the reference pattern BP (S23) is performed. When the amount of misalignment falls within or below a predetermined tolerable range, the step of "Ion Implantation" of the p-type impurity (S25) is performed. Note that, when the amount of misalignment exceeds the tolerable range, the removal of the photoresist layer PR4, the formation of the photoresist layer PR4, and the measurement of the amount of misalignment are repeatedly performed until the amount of misalignment falls within or below the tolerable range. Then, after the step of "Ion Implantation" (S25) is completed, the step of "Removing Photoresist Layer PR4 and Inspection Patterns CP4" (S26) is performed. That is, the photoresist layer PR4 and the inspection patterns CP4 each serving as a mask for the ion implantation step are removed by asking treatment. That is, when the step of "Measuring Amount of Misalignment" of the inspection pattern CP4 (S23) is performed, only the semiconductor regions EXN are formed, while the semiconductor regions EXP are not formed.

As shown in FIG. 14, each of the inspection patterns CP4 has a rectangular frame-like shape (frame shape) and also has a frame width W4. The frame width W4 of the inspection pattern CP4 is larger than the frame width W3 of the inspection pattern CP3 so that the inspection pattern CP4 covers the entire inspection pattern trace TCP3. After the step of ion implantation for the semiconductor regions EXN described above is completed, the photoresist layer PR3 and the inspection pattern CP3 have been removed but, in the main surface 1a of the semiconductor substrate 1, the inspection pattern traces TCP3 are formed. Accordingly, when the photoresist layer PR4 and the inspection patterns CP4 are formed in the ion implantation step for the semiconductor regions EXP and the step of "Measuring Amount of Misalignment" of each of the inspection patterns CP4 (S23) is performed, it is important for the inspection pattern CP4 to cover the entire inspection pattern trace TCP3. That is, it is important to provide the relationship between the inspection patterns CP4 and CP3 which is the same as the relationship between the inspection patterns CP2 and CP1 described above.

FIG. 15A is a plan view showing the reference pattern BP and each of the inspection patterns CP4 which are formed in the inspection pattern formation region CPR in the ion implantation step for the semiconductor regions EXP. FIG. 15B shows a light intensity along the line D-D in FIG. 15A. As shown in FIG. 15A, the entire inspection pattern trace TCP3 is covered with the inspection pattern CP4 and enclosed in the inspection pattern CP4. That is, since the inspection pattern trace TCP3 is not exposed around (outside) the inspection pattern CP4, as shown in FIG. 15B, in the step of "Measuring Amount of Misalignment" of the inspection pattern CP4 (S23), it is possible to precisely detect the inner and outer sides of the inspection pattern CP4 shown in FIG. 15A and prevent erroneous detection of the inspection pattern CP4.

Note that the ion implantation step for the semiconductor regions EXN can also be performed after the ion implantation step for the semiconductor regions EXP. In that case, in the ion implantation step for the semiconductor regions EXP, the inspection patterns CP3 are used and, in the ion implantation step for the semiconductor regions EXN, the inspection patterns CP4 are used.

Next, the step of "Forming Side-Wall Insulating Films SW" (S9) shown in FIG. 2 is performed.

Figure 10:
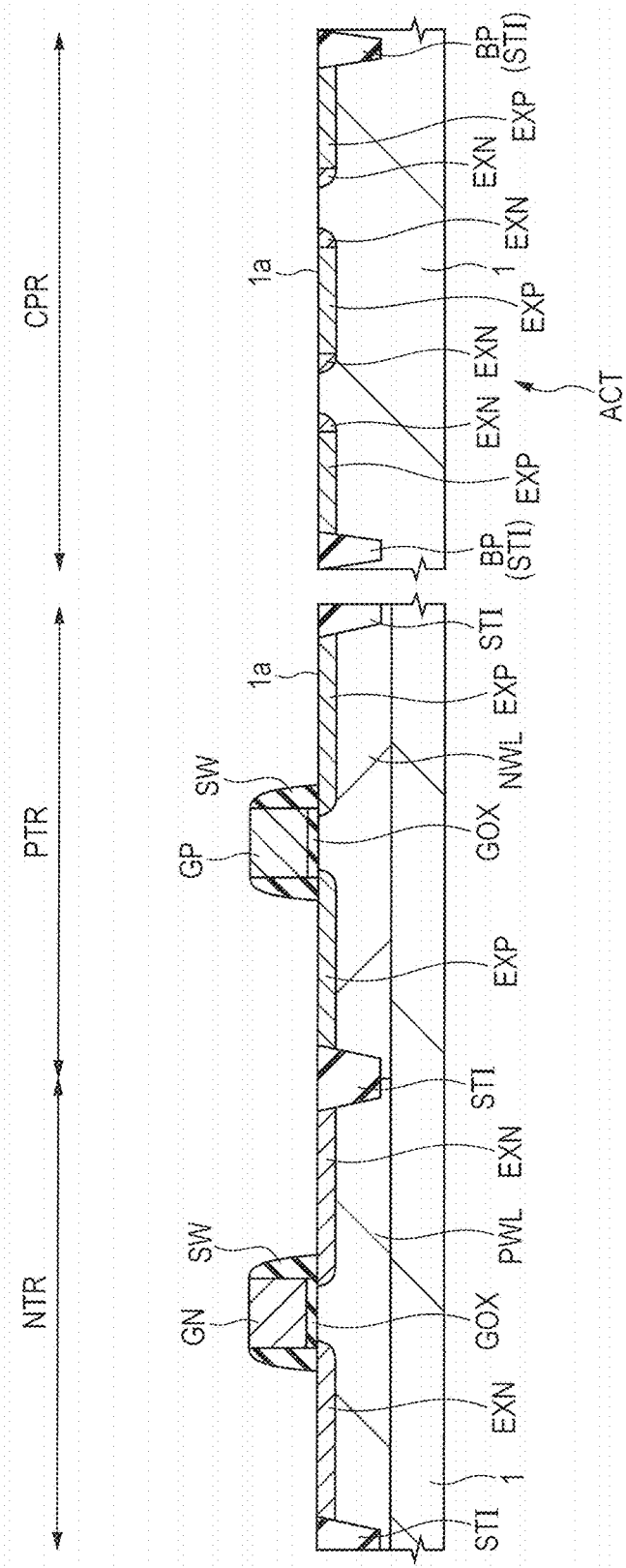
FIG. 10 is a cross-sectional view of the semiconductor device during the manufacturing process thereof, which is subsequent to FIG. 9.

As shown in FIG. 10, over the respective side walls of the gate electrodes GN and GP, the side-wall insulating films SW are formed. For example, an insulating film such as a silicon dioxide film is deposited over the main surface 1a of the semiconductor substrate 1 so as to cover the upper and side surfaces of the gate electrodes GN and GP and then subjected to anisotropic dry etching to form the side-wall insulating films SW over the respective side walls of the gate electrodes GN and GP. As each of the side-wall insulating films SW, not only a silicon dioxide film, but also a silicon nitride film, a multi-layer structure including a silicon dioxide film and a silicon nitride film, or a three-layer structure including a silicon dioxide film, a silicon nitride film, and a silicon dioxide film may also be used. Note that, in the inspection pattern formation region CPR, the side-wall insulating films SW are not formed.

Next, the step of "Ion Implantation for Semiconductor Regions NH" (S10) shown in FIG. 2 is performed.

Figure 11:
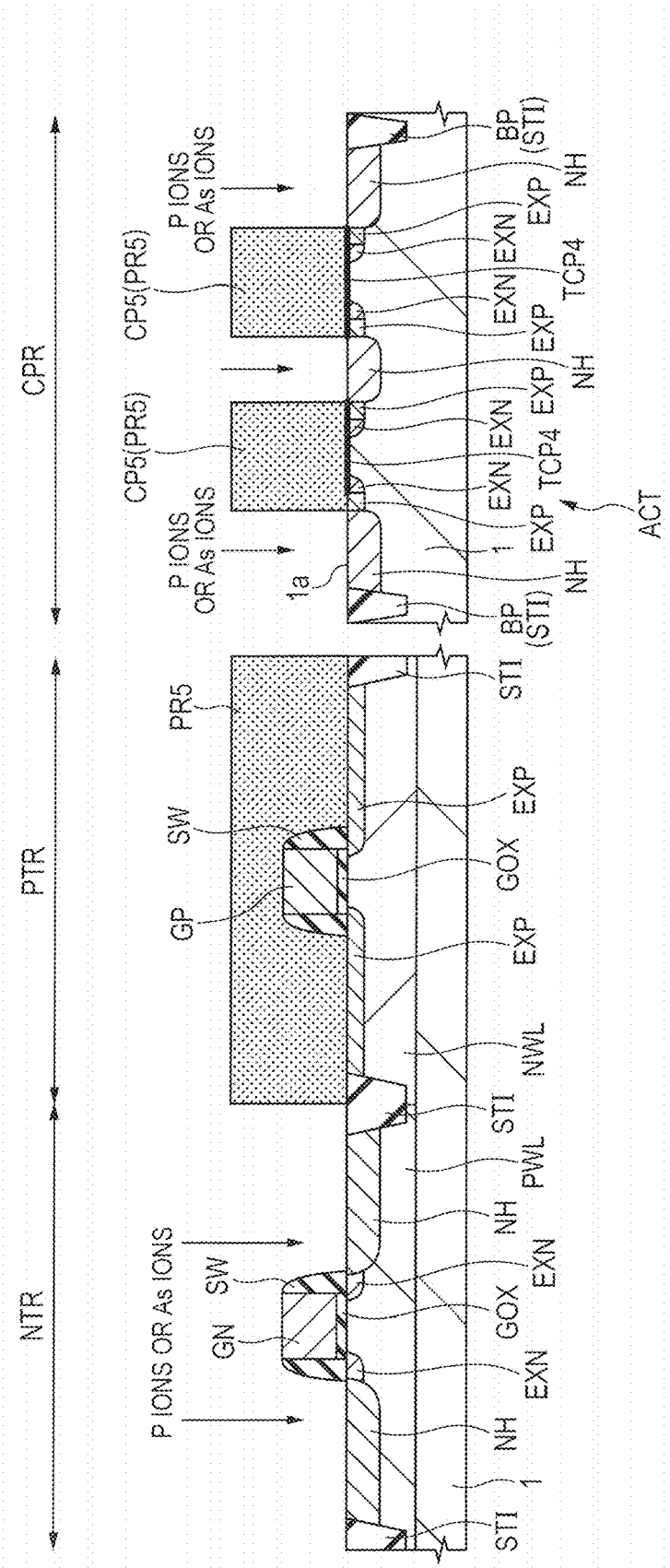
FIG. 11 is a cross-sectional view of the semiconductor device during the manufacturing process thereof, which is subsequent to FIG. 10.

As shown in FIG. 11, a photoresist layer PR5 is formed which covers the p-channel MISFET formation region PTR and exposes the n-channel MISFET formation region NTR. At this time, in the inspection pattern formation region CPR, the inspection patterns (to-be-aligned layers) CP5 made of the photoresist layer PR5 are formed. Then, using the photoresist layer PR5 as a mask, into the main surface 1a of the semiconductor substrate 1 exposed from the photoresist layer PR5, an n-type impurity such as, e.g., phosphoric ions or arsenic ions is ion-implanted at a dose of 1 to $5 \times 10^{15}$ cm$^{-2}$ to form the semiconductor regions NH. The semiconductor regions NH are formed in the main surface 1a of the semiconductor substrate 1 where the gate electrode GN, the side-wall insulating films SW, and the isolation films STI are not present by self-alignment with the gate electrode GN, the side-wall insulating films SW, and the isolation films STI. In the inspection pattern formation region CPR, the semiconductor regions NH are formed in the areas exposed from the inspection patterns CP5. However, the semiconductor regions NH are completed through the activation anneal described later and are impurity implantation regions at this process stage. In the inspection pattern formation region CPR, in the semiconductor regions EXP, EXN, and NH, amorphous silicon layers are formed. In the area of the lower part of each of the inspection patterns CP5 where none of the semiconductor regions EXP, EXN, and NH is formed, the main surface 1a of the semiconductor substrate 1 made of monocrystalline silicon remains.

Before the ion implantation of an n-type impurity is performed herein, as shown in FIG. 17, the step of "Measuring Amount of Misalignment" of each of the inspection patterns CP5 with respect to the reference pattern BP (S23) is performed using the inspection pattern CP5. When the amount of misalignment falls within or below a predetermined tolerable range, the step of "Ion Implantation" of the n-type impurity (S25) is performed. When the amount of misalignment exceeds the tolerable range, the removal of the photoresist layer PR5, the formation of the photoresist layer PR5, and the measurement of the amount of misalignment are repeatedly performed until the amount of misalignment falls within or below the tolerable range. Then, after the step of "Ion Implantation" (S25) is completed, the step of "Removing Photoresist Layer PR5 and Inspection Patterns CP5" (S26) is performed. That is, the photoresist layer PR5 and the inspection patterns CP5 each serving as a mask for the ion implantation step are removed by asking treatment.

As shown in FIG. 14, each of the inspection patterns CP5 has a rectangular frame-like shape (frame shape) and also has a frame width W5. The frame width W5 of the inspection pattern CP5 is larger than the frame width W4 of the inspection pattern CP4 and covers the entire inspection pattern trace TCP4. After the ion implantation step for the semiconductor regions EXP described above is completed, the photoresist layer PR4 and the inspection patterns CP4 have been removed but, in the main surface 1a of the semiconductor substrate 1, the inspection pattern traces TCP4 are formed. Accordingly, when the photoresist layer PR5 and the inspection patterns CP5 are formed in the ion implantation step for the semiconductor regions NH and the step of "Measuring Amount of Alignment" of each of the inspection patterns CP5 (S23) is performed, it is important for the inspection pattern CP5 to cover the entire inspection pattern trace TCP4. It is also important for the inspection pattern CP5 to cover the entire inspection pattern traces TCP3 and TCP5. It is important to provide the relationship between the inspection patterns CP5 and CP4 which is the same as the relationship between the inspection patterns CP2 and CP1 described above.

Next, the step of "Ion Implantation for Semiconductor Regions PH" (S11) shown in FIG. 2 is performed.

Figure 12:
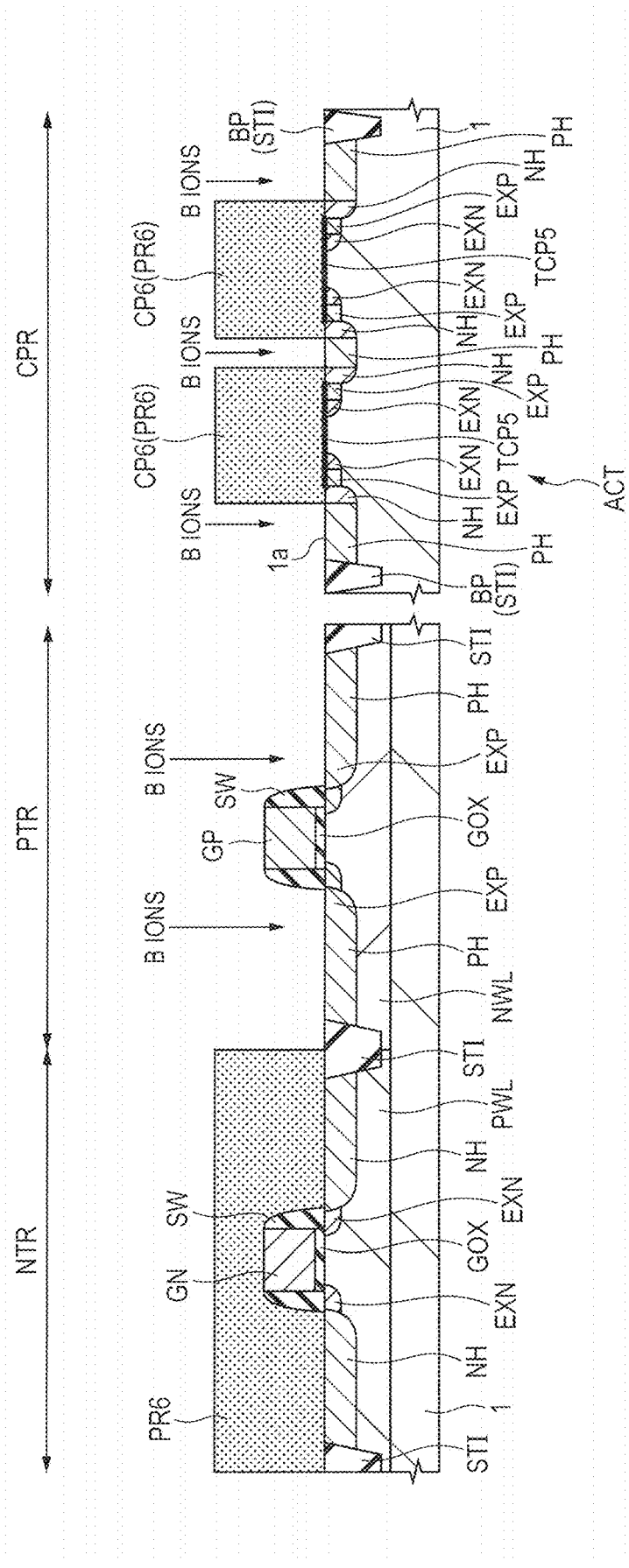
FIG. 12 is a cross-sectional view of the semiconductor device during the manufacturing process thereof, which is subsequent to FIG. 11.

As shown in FIG. 12, a photoresist layer PR6 is formed which covers the n-channel MISFET formation region NTR and exposes the p-channel MISFET formation region PTR. At this time, in the inspection pattern formation region CPR, the inspection patterns (to-be-aligned layers) CP6 made of the photoresist layer PR6 are formed. Then, using the photoresist layer PR6 as a mask, into the main surface 1a of the semiconductor substrate 1 exposed from the photoresist layer PR6, a p-type impurity such as, e.g., boron ions is ion-implanted at a dose of 1 to $5 \times 10^{15}$ cm$^{-2}$ to form the semiconductor regions PH. The semiconductor regions PH are formed in the main surface 1a of the semiconductor substrate 1 where the gate electrode GP, the side-wall insulating films SW, and the isolation films STI are not present by self-alignment with the gate electrode GP, the side-wall insulating films SW, and the isolation films STI. In the inspection pattern formation region CPR, the semiconductor regions PH are formed in the areas exposed from the inspection patterns CP6. However, the semiconductor regions PH are completed through the activation anneal described later and are impurity implantation regions at this process stage. In the inspection pattern formation region CPR, in the semiconductor regions EXP, EXN, NH, and PH, amorphous silicon layers are formed. In the area of the lower part of each of the inspection patterns CP6 where none of the semiconductor regions EXP, EXN, NH, and PH is formed, the main surface 1a of the semiconductor substrate 1 made of monocrystalline silicon remains.

Before the ion implantation of the p-type impurity is performed herein, as shown in FIG. 17, using the inspection patterns CP6, the step of "Measuring Amount of Misalignment" of each of the inspection patterns CP6 with respect to the reference pattern BP (S23) is performed. When the amount of misalignment falls within or below a predetermined tolerable range, the step of "Ion Implantation" of the p-type impurity (S25) is performed. Note that, when the amount of misalignment exceeds the tolerable range, the removal of the photoresist layer PR6, the formation of the photoresist layer PR6, and the measurement of the amount of misalignment are repeatedly performed. Then, after the step of "Ion Implantation" (S25) is completed, the step of "Removing Photoresist Layer PR6 and Inspection Patterns CP6" (S26) is performed. That is, the photoresist layer PR6 and the inspection patterns CP6 each serving as a mask for the ion implantation step is removed by asking treatment.

As shown in FIG. 14, each of the inspection patterns CP6 has a rectangular frame-like shape (frame shape) and also has a frame width W6. The frame width W6 of the inspection pattern CP6 is larger than the frame width W5 of the inspection pattern CP5 and covers the entire inspection pattern trace TCP5. After the ion implantation step for the semiconductor regions NH described above is completed, the photoresist layer PR5 and the inspection patterns CP5 have been removed but, in the main surface 1a of the semiconductor substrate 1, the inspection pattern traces TCP5 are formed. Accordingly, when the photoresist layer PR6 and the inspection patterns CP6 are formed in the ion implantation step for the semiconductor regions PH and the step of "Measuring Amount of Alignment" of each of the inspection patterns CP6 (S23) is performed, it is important for the inspection pattern CP6 to cover the entire inspection pattern trace TCP5. That is, it is important to provide the relationship between the inspection patterns CP6 and CP5 which is the same as the relationship between the inspection patterns CP2 and CP1 described above.

Next, the step of "Activation Anneal" (S12) shown in FIG. 2 is performed.

By performing heat treatment at 900 to 1000° C. on the semiconductor substrate 1, it is intended to activate the ion-implanted impurities and eliminate a crystal defect in the semiconductor substrate 1 amorphized by the ion implantation. That is, by the activation anneal, the polysilicon film PF in which the n-type impurity is ion-implanted, the polysilicon film PF in which the p-type impurity is ion-implanted, and the semiconductor regions EXN, EXP, NH, and PH are activated. Note that the activation anneal for the polysilicon film PF and the activation anneal for the semiconductor regions EXN, EXP, NH, and PH may also be performed in different steps. That is, the activation anneal for the polysilicon film PF may also be performed subsequently to the step of "Impurity Ion Implantation for Gate Electrodes" (S5) in FIG. 2.

Thus, the n-channel MISFET QN and the p-channel MISFET QP which are shown in FIG. 1 are formed. Note that each of the source region S and the drain region D of the n-channel MISFET QN includes the semiconductor regions EXN and NH shown in FIG. 12, and each of the source region S and the drain region D of the p-channel MISFET QP includes the semiconductor regions EXP and PH shown in FIG. 12.

Note that FIG. 16 is a plan view of the inspection pattern formation region in the semiconductor device in the present embodiment. FIG. 16 shows an example in which each of center points C3, C4, C5, and C6 of the inspection patterns CP3, CP4, CP5, and CP6 is displaced from the center point C0 of the reference pattern BP in a given direction.

As described above, it is necessary that the inspection pattern CP4 covers the entire inspection pattern trace TCP3, the inspection pattern CP5 covers the entire inspection pattern trace TCP4, and the inspection pattern CP6 covers the entire inspection pattern trace TCP5. In other words, the inspection pattern CP4 covers the entire inspection pattern trace TCP3, the inspection pattern CP5 covers the entire inspection pattern traces TCP3 and TCP4, and the inspection pattern CP6 covers the entire inspection pattern traces TCP3, TCP4, and TCP5. Accordingly, when α3 is a mask alignment tolerance for the photoresist layer P3, α4 is a mask alignment tolerance for the photoresist layer PR4, α5 is a mask alignment tolerance for the photoresist layer PR5, and α6 is a mask alignment tolerance for the photoresist layer PR6 in the photolithographic step, the frame width W4 of the inspection pattern CP4 needs to satisfy W4≥W3+α3+α4 in consideration of the frame width W3 of the inspection pattern CP3 and the alignment tolerance a in each of the positive and negative X- or Y-directions. Also, the frame width W5 of the inspection pattern CP5 needs to satisfy W5≥W3+α3+2α4+α5, and the frame width W6 of the inspection pattern CP6 needs to satisfy W6≥W3+α3+2α4+2α5+α6.

<Characteristic Features and Effects of Method of Manufacturing Semiconductor Device in Present Embodiment>

According to the present embodiment, a first inspection pattern trace formed in the inspection pattern formation region by a first inspection pattern formed of a first photoresist layer serving as a mask for a first ion implantation step is completed covered in plan view with a second inspection pattern formed of a second photoresist layer serving as a mask for a second ion implantation step subsequent to the first ion implantation step, and then the amount of misalignment of the second inspection pattern is measured.

As a result, in the measurement of the amount of misalignment of the second inspection pattern, it is possible to prevent erroneous detection of the second inspection pattern resulting from the first inspection pattern trace. This can prevent the re-formation of the photoresist layer PR2 resulting from erroneous detection and thus reduce manufacturing cost and a manufacturing time. In addition, since inspection patterns for mask layers for a plurality of ion implantation steps can be formed in one inspection pattern formation region, it is possible to reduce the number of the inspection pattern formation regions and reduce the size of the semiconductor device.

Particularly when the quantity of impurity ions implanted in the first ion implantation step is not less than $1 \times 10^{15}$ cm$^{-2}$, an inspection pattern trace is likely to be formed in a semiconductor substrate or a polycrystalline silicon layer. Accordingly, it is important to form the second inspection pattern into a shape which completely covers the first inspection pattern trace in plan view. That is, it is important to form the second inspection pattern into a continuously extending shape which completely covers the first inspection pattern trace and also covers a region in which an impurity is implanted in the first ion implantation step in plan view.

For example, when the two-dimensional shape of the first inspection pattern is like a frame, the second inspection pattern also has a frame-like shape. The frame width of the second inspection pattern is larger (wider) than the frame width of the first inspection pattern.

A third inspection pattern formed of a third photoresist layer serving as a mask for a third ion implantation step subsequent to the second ion implantation step has a shape which covers the entire second inspection pattern trace in plan view. Also, the shape of the third inspection pattern completely covers both of the second and first inspection pattern traces.

Note that, in the present embodiment, similarly to the reference pattern BP having the frame-like shape, each of the inspection patterns CP1, CP2, CP3, CP4, CP5, and CP6 also has the frame-like shape. However, while the reference pattern BP has the frame-like shape, each of the inspection patterns CP1, CP2, CP3, CP4, CP5, and CP6 may also have a square shape.

(Modifications)

While the invention achieved by the present inventors has been specifically described heretofore on the basis of the embodiment thereof, the present invention is not limited to the foregoing embodiment. It will be appreciated that various changes and modifications can be made in the invention within the scope not departing from the gist thereof. The following will show a plurality of modifications. It is also possible to appropriately combine and implement the individual modifications.

(Modification 1)

Modification 1 relates to the reference pattern and the inspection patterns in the foregoing embodiment.

FIG. 18 is a plan view of an inspection pattern formation region in Modification 1. In the example shown in the foregoing embodiment, each of the inspection patterns CP1, CP2, CP3, CP4, CP5, and CP6 is formed inside the reference pattern BP. By contrast, in Modification 1, each of inspection patterns CP3a and CP4a having frame-like shapes is formed outside a reference pattern BPa having a frame-like shape. The inspection patterns CP3a and CP4a respectively correspond to the inspection patterns CP3 and CP4 in the foregoing embodiment.

In the same manner as in the foregoing embodiment, it is important to form the inspection pattern CP4a into a shape which completely covers an inspection pattern trace TCP3a.

<Modification 2>

Modification 2 relates to the reference pattern and the inspection patterns in the foregoing embodiment.

FIG. 19 is a plan view of an inspection pattern formation region in Modification 2. In the example shown in the foregoing embodiment, each of the reference pattern BP and the inspection patterns CP1, CP2, CP3, CP4, CP5, and CP6 has the frame-like shape. By contrast, in Modification 2, each of a reference pattern BPb and inspection patterns CP3b and CP4b has a frame-like shape from which corner portions are removed in plan view. The inspection patterns CP3b and CP4b respectively correspond to the inspection patterns CP3 and CP4 in the foregoing embodiment.

In the same manner as in the foregoing embodiment, it is important to form the inspection pattern CP4b into a shape which completely covers an inspection pattern trace TCP3b in plan view.

<Modification 3>

Modification 3 relates to the reference pattern and the inspection patterns in the foregoing embodiment.

Figure 20:
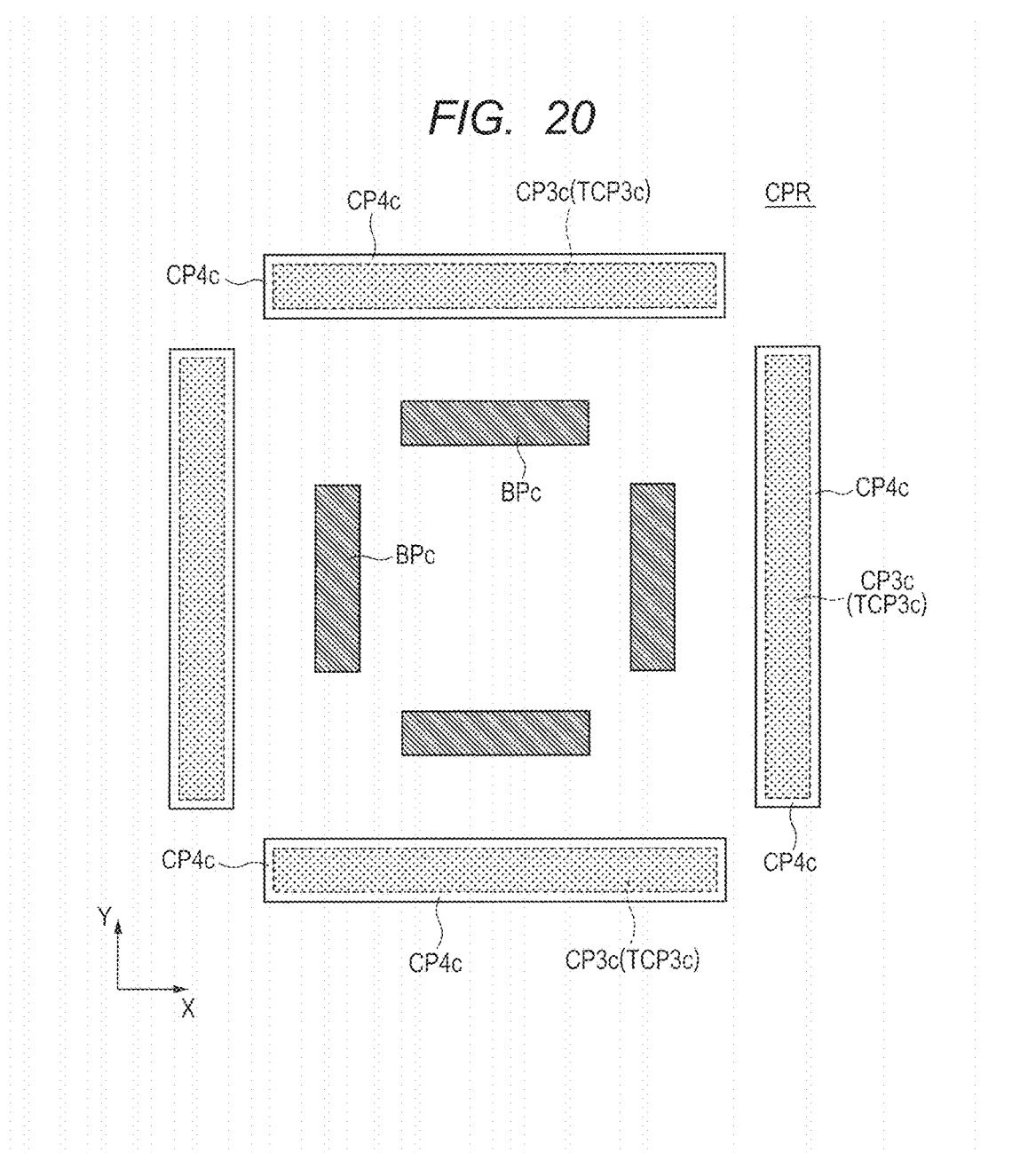
FIG. 20 is a plan view of an inspection pattern formation region in Modification 3.

FIG. 20 is a plan view of an inspection pattern formation region in Embodiment 3. In Modification 1, each of the reference pattern BP1 and the inspection patterns CP3a and CP4a has the frame-like shape. By contrast, in Modification 3, each of a reference pattern BPc and inspection patterns CP3c and CP4c has a frame-like shape from which corners are removed in plan view. The inspection patterns CP3c and CP4c respectively correspond to the inspection patterns CP3 and CP4 in the foregoing embodiment.

In the same manner as in the foregoing embodiment, it is important to form the inspection pattern CP4c into a shape which completely covers an inspection pattern trace TCP3c in plan view.

<Modification 4>

Modification 4 relates to the reference pattern and the inspection patterns in the foregoing embodiment.

Figure 21:
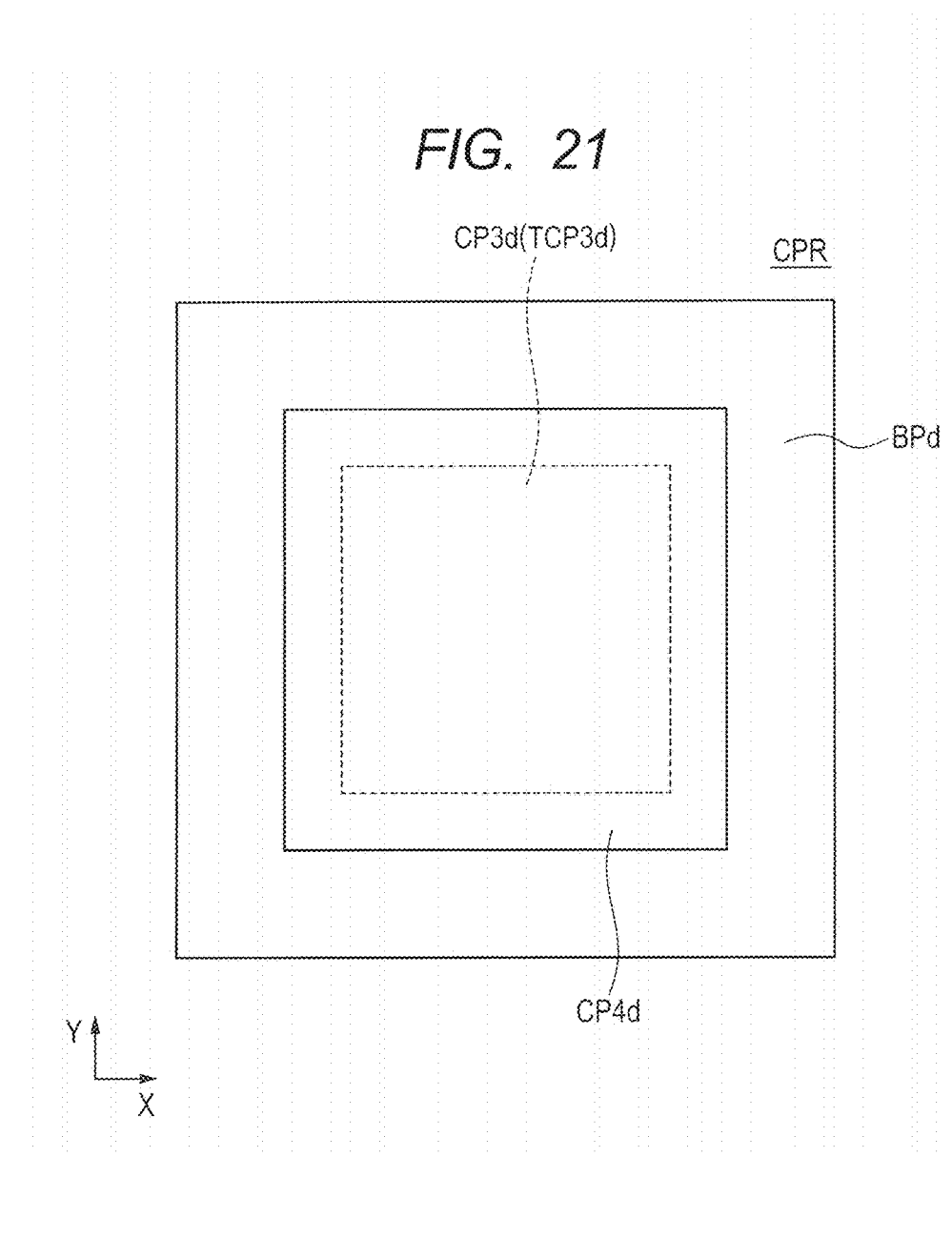
FIG. 21 is a plan view of an inspection pattern formation region in Modification 4.

FIG. 21 is a plan view of an inspection pattern formation region in Modification 4. In the example shown in the foregoing embodiment, each of the inspection patterns CP1, CP2, CP3, CP4, CP5, and CP6 having the frame-like shapes is formed inside the reference pattern BP having the frame-like shape. By contrast, in Modification 4, each of inspection patterns CP3d and CP4d having square plate-like shapes is formed inside a reference pattern BPd having a square plate-like shape. The inspection patterns CP3d and CP4d respectively correspond to the inspection patterns CP3 and CP4 in the foregoing embodiment.

In the same manner as in the foregoing embodiment, it is important to form the inspection pattern CP4d into a shape which completely covers an inspection pattern trace TCP3d in plan view.

<Modification 5>

Modification 5 relates to the reference pattern and the inspection patterns in Modification 4 described above.

Figure 22:
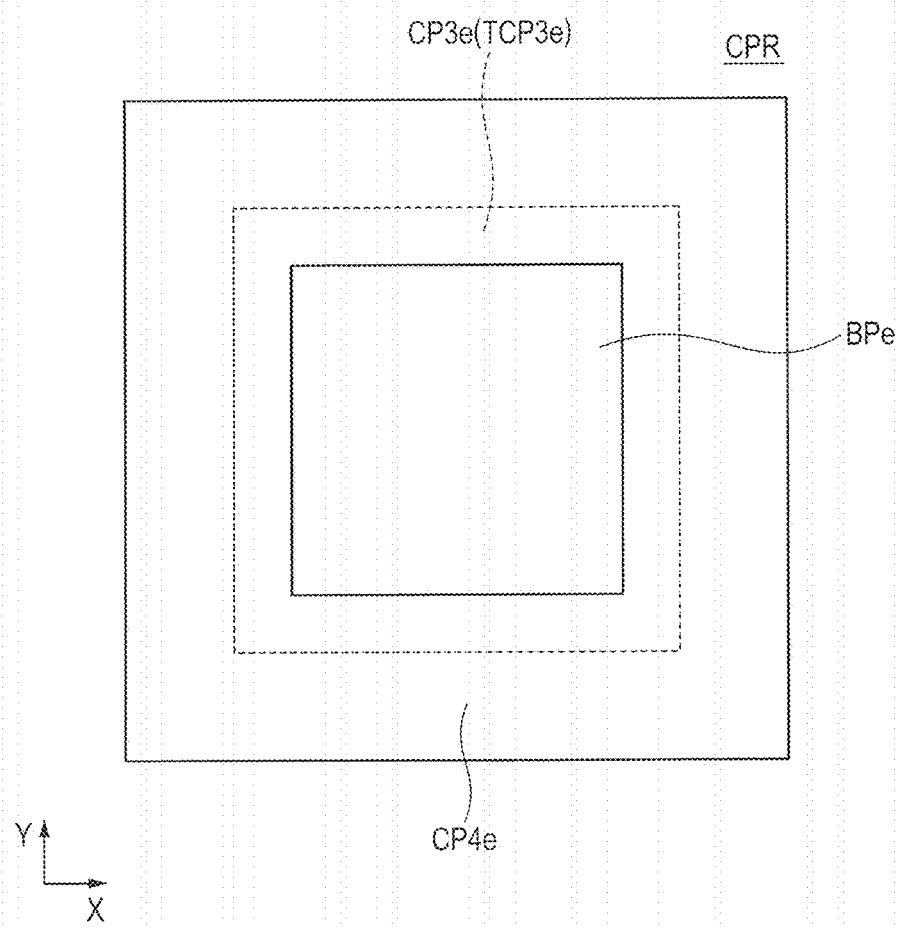
FIG. 22 is a plan view of an inspection pattern formation region in Modification 5.

FIG. 22 is a plan view of an inspection pattern formation region in Modification 5. In Modification 4 described above, each of the inspection patterns CP3$d$ and CP4$d$ having the square shapes is formed in the reference pattern BPd having the square shape. By contrast, in Modification 5, each of inspection patterns CP3$e$ and CP4$e$ having square plate-like shapes is formed outside a reference pattern BPe having a square plate-like shape. The inspection patterns CP3$e$ and CP4$e$ respectively correspond to the inspection patterns CP3 and CP4 in the foregoing embodiment.

In the same manner as in the foregoing embodiment, it is important to form the inspection pattern CP4$e$ into a shape which completely covers an inspection pattern trace TCP3$e$ in plan view.

<Modification 6>

Modification 6 relates to the reference pattern and the inspection patterns in the foregoing embodiment.

FIG. 23 is a plan view of an inspection pattern formation region in Modification 6. In Modification 6, a reference pattern BPf includes a plurality of the reference patterns BPf, an inspection pattern CP3$f$ includes a plurality of the inspection patterns CP3$f$, and an inspection pattern CP4$f$ includes a plurality of the inspection patterns CP4$f$. As shown in FIG. 23, in the first and third quadrants, the plurality of reference patterns BPf are equidistantly arranged in an X-direction to extend in a Y-direction, and the plurality of inspection patterns CP3$f$ and CP4$f$ are equidistantly arranged in the X-direction to extend in the Y-direction. In the second and fourth quadrants, the plurality of reference patterns BPf are equidistantly arranged in the Y-direction to extend in the X-direction, and the plurality of inspection patterns CP3$f$ and CP4$f$ are equidistantly arranged in the Y-direction to extend in the X-direction. The plurality of inspection patterns CP3$f$ and CP4$f$ respectively correspond to the inspection patterns CP3 and CP4 in the foregoing embodiment.

In the same manner as in the foregoing embodiment, it is important to form the inspection patterns CP4$f$ into shapes which completely cover individual inspection pattern traces TCP3$f$ in plan view.

What is claimed is:

1. A method of manufacturing a semiconductor device, comprising the steps of:
   (a) providing a semiconductor substrate having a MISFET formation region and an inspection pattern formation region in a main surface thereof;
   (b) embedding an insulating film in a trench formed in the main surface to form an isolation film, form first and second active regions each surrounded by the isolation film in the MISFET formation region, and form a reference pattern made of the isolation film in a first area in the inspection pattern formation region;
   (c) forming a first mask layer made of a first photoresist layer which covers the first active region and exposes the second active region in the MISFET formation region, while forming a first inspection pattern made of the first photoresist layer which covers a second area other than the first area and exposes a third area other than the first area in the inspection pattern formation region;
   (d) measuring a first amount of misalignment of the first inspection pattern with respect to the reference pattern;
   (e) ion-implanting a first impurity into the second active region exposed from the first mask layer in the MIS-FET formation region, while ion-implanting the first impurity into the third area exposed from the first inspection pattern in the inspection pattern formation region;
   (f) removing the first mask layer and the first inspection pattern;
   (g) forming a second mask layer made of a second photoresist layer which covers the second active region and exposes the first active region in the MISFET formation region, while forming a second inspection pattern made of the second photoresist layer which covers the second and third areas and exposes the first area in the inspection pattern formation region; and
   (h) measuring a second amount of misalignment of the second inspection pattern with respect to the reference pattern,
   wherein, in plan view, the second inspection pattern covers the entire second area where the first inspection pattern was formed to extend continuously from the second area to the third area.

2. The method of manufacturing the semiconductor device according to claim 1,
   wherein, in the step (e), a dose of the first impurity is not less than $1 \times 10^{15}$ cm$^{-2}$.

3. The method of manufacturing the semiconductor device according to claim 1, further comprising, after the step (h), the step of:
   (i) ion-implanting a second impurity into the first active region exposed from the second mask layer in the MISFET formation region, while ion-implanting the second impurity into the third area exposed from the second inspection pattern in the inspection pattern formation region.

4. The method of manufacturing the semiconductor device according to claim 1,
   wherein each of the first and second inspection patterns has a frame-like shape, and
   wherein a frame width of the second inspection pattern is larger than a frame width of the first inspection pattern.

5. The method of manufacturing the semiconductor device according to claim 4,
   wherein the reference pattern has a frame-like shape.

6. The method of manufacturing the semiconductor device according to claim 5,
   wherein each of the first and second inspection patterns is disposed inside the reference pattern.

7. The method of manufacturing the semiconductor device according to claim 5,
   wherein each of the first and second inspection patterns is disposed outside the reference pattern.

8. The method of manufacturing the semiconductor device according to claim 4,
   wherein each of the reference pattern and the first and second inspection patterns has a frame-like shape from which corner portions are removed.

9. The method of manufacturing the semiconductor device according to claim 8,
   wherein each of the first and second inspection patterns is disposed inside the reference pattern.

10. The method of manufacturing the semiconductor device according to claim 8,
    wherein each of the first and second inspection patterns is disposed outside the reference pattern.

11. A method of manufacturing a semiconductor device, comprising the steps of:

(a) providing a semiconductor substrate having a MISFET formation region and an inspection pattern formation region in a main surface thereof;
(b) embedding an insulating film in a trench formed in the main surface to form an isolation film, form first and second active regions each surrounded by the isolation film in the MISFET formation region, and form a reference pattern made of the isolation film in a first area in the inspection pattern formation region;
(c) depositing a polysilicon film over the main surface of the semiconductor substrate;
(d) forming a first mask layer made of a first photoresist layer which covers the first active region and exposes the second active region over the polysilicon film in the MISFET formation region, while forming a first inspection pattern made of the first photoresist layer which covers a second area other than the first area and exposes a third area other than the first area over the polysilicon film in the inspection pattern formation region;
(e) measuring a first amount of misalignment of the first inspection pattern with respect to the reference pattern;
(f) ion-implanting a first impurity into the polysilicon film over the second active region exposed from the first mask layer in the MISFET formation region, while ion-implanting the first impurity into the polysilicon film over the third area in the inspection pattern formation region;
(g) removing the first mask layer and the first inspection pattern;
(h) forming a second mask layer made of a second photoresist layer which covers the second active region and exposes the first active region over the polysilicon film in the MISFET formation region, while forming a second inspection pattern made of the second photoresist layer which covers the second and third areas and exposes the first area over the polysilicon film in the inspection pattern formation region; and
(i) measuring a second amount of misalignment of the second inspection pattern with respect to the reference pattern,
wherein, in plan view, the second inspection pattern covers the entire second area where the first inspection pattern was formed to extend continuously from the second area to the third area.

12. The method of manufacturing the semiconductor device according to claim 11,
wherein, in the step (f), a dose of the first impurity is not less than $1 \times 10^{15}$ cm$^{-2}$.

13. The method of manufacturing the semiconductor device according to claim 11, further comprising, after the step (i), the step of:
(j) ion-implanting a second impurity into the polysilicon film over the first active region exposed from the second mask layer in the MISFET formation region, while ion-implanting the second impurity into the polysilicon film over the third area in the inspection pattern formation region,
wherein a conductivity type of the second impurity is opposite to a conductivity type of the first impurity.

14. A method of manufacturing a semiconductor device, comprising the steps of:

(a) providing a semiconductor substrate having a first MISFET formation region, a second MISFET formation region, and an inspection pattern formation region in a main surface thereof;
(b) embedding an insulating film in a trench formed in the main surface to form an isolation film, form a first active region surrounded by the isolation film in the first MISFET formation region, form a second active region surrounded by the isolation film in the second MISFET formation region, and form a reference pattern made of the isolation film in a first area in the inspection pattern formation region;
(c) forming a first gate electrode over the main surface in the first active region via a first gate insulating film, while forming a second gate electrode over the main surface in the second active region via a second gate insulating film;
(d) forming a first mask layer made of a first photoresist layer which covers the first MISFET formation region and exposes the second MISFET formation region, while forming a first inspection pattern made of the first photoresist layer which covers a second area other than the first area and exposes a third area other than the first area in the inspection pattern formation region;
(e) measuring a first amount of misalignment of the first inspection pattern with respect to the reference pattern;
(f) ion-implanting a first impurity into the second active region exposed from the first mask layer, while ion-implanting the first impurity into the third area exposed from the first inspection pattern in the inspection pattern formation region;
(g) removing the first mask layer and the first inspection pattern;
(h) forming a second mask layer made of a second photoresist layer which covers the second MISFET formation region and exposes the first the MISFET formation region, while forming a second inspection pattern made of the second photoresist layer which covers the second and third areas and exposes the first area in the inspection pattern formation region;
(i) measuring a second amount of misalignment of the second inspection pattern with respect to the reference pattern; and
(j) ion-implanting a second impurity into the first active region exposed from the second mask layer,
wherein, in plan view, the second inspection pattern covers the entire second area where the first inspection pattern was formed to extend continuously from the second area to the third area.

15. The method of manufacturing the semiconductor device according to claim 14,
wherein, in the step (f), a dose of the first impurity is not less than $1 \times 10^{15}$ cm$^{-2}$.

16. The method of manufacturing the semiconductor device according to claim 14, further comprising, between the steps (c) and (d), the step of:
(k) forming side-wall insulating films over respective side walls of the first and second gate electrodes.

17. The method of manufacturing the semiconductor device according to claim 14,
wherein a conductivity type of the second impurity is opposite to a conductivity type of the first impurity.

* * * * *